(12) United States Patent
Suzuki

(10) Patent No.: US 9,997,441 B2
(45) Date of Patent: Jun. 12, 2018

(54) SUPPORT MEMBER, WIRING SUBSTRATE, METHOD FOR MANUFACTURING WIRING SUBSTRATE, AND METHOD FOR MANUFACTURING SEMICONDUCTOR PACKAGE

(71) Applicant: SHINKO ELECTRIC INDUSTRIES CO., LTD., Nagano (JP)

(72) Inventor: Tomohiro Suzuki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days. days.

(21) Appl. No.: 14/810,594

(22) Filed: Jul. 28, 2015

(65) Prior Publication Data

US 2016/0035661 A1 Feb. 4, 2016

(30) Foreign Application Priority Data

Jul. 31, 2014 (JP) .................. 2014-156617

(51) Int. Cl.
  *H01L 23/498* (2006.01)
  *H01L 21/48* (2006.01)
  (Continued)

(52) U.S. Cl.
  CPC ...... *H01L 23/49822* (2013.01); *H01L 21/486* (2013.01); *H01L 21/4857* (2013.01);
  (Continued)

(58) Field of Classification Search
  CPC .................. H01L 23/49822; H05K 3/0097
  (Continued)

(56) References Cited

U.S. PATENT DOCUMENTS 8,609,997 B2 * 12/2013 Shomura ............. H05K 3/4602
  174/260
9,040,832 B2 * 5/2015 Shimizu ............. H01L 21/4857
  174/251

(Continued)

FOREIGN PATENT DOCUMENTS

JP 2008-4862 1/2008
JP 2009-206409 9/2009

(Continued)

OTHER PUBLICATIONS

Office Action dated Dec. 19, 2017 issued with respect to the basic Japanese Patent Application No. 2014-156617.

*Primary Examiner* — Hoa C Nguyen
*Assistant Examiner* — Stanley Tso
(74) *Attorney, Agent, or Firm* — IPUSA, PLLC

(57) ABSTRACT

A wiring substrate includes a support member, and a wiring member formed on one side of the support member. The support member includes metal foils and at least one resin layer alternately layered, so that one of the metal foils is provided as a first outermost layer on the one side of the support member and another one of the metal foils is provided as a second outermost layer on another side of the support member. The first outermost layer includes thick and thin foils that are peelably adhered. The thick foil contacts the at least one resin layer. One surface of the thin foil faces an outer side of the support member. The wiring member includes wiring layers and an insulating layer alternately layered on the thin foil. The number of the metal foils and the number of the wiring layers are the same.

18 Claims, 23 Drawing Sheets

(51) Int. Cl.
- *H01L 23/538* (2006.01)
- *H01L 23/00* (2006.01)
- *H01L 21/683* (2006.01)
- *H05K 3/46* (2006.01)
- *H01L 21/56* (2006.01)
- *H01L 23/31* (2006.01)

(52) U.S. Cl.
CPC .... *H01L 21/6835* (2013.01); *H01L 23/49811* (2013.01); *H01L 23/49827* (2013.01); *H01L 23/49833* (2013.01); *H01L 23/49838* (2013.01); *H01L 23/5389* (2013.01); *H01L 24/97* (2013.01); *H05K 3/4682* (2013.01); *H01L 21/561* (2013.01); *H01L 21/568* (2013.01); *H01L 23/3128* (2013.01); *H01L 23/49894* (2013.01); *H01L 24/13* (2013.01); *H01L 24/16* (2013.01); *H01L 24/32* (2013.01); *H01L 24/45* (2013.01); *H01L 24/48* (2013.01); *H01L 24/81* (2013.01); *H01L 24/83* (2013.01); *H01L 24/85* (2013.01); *H01L 24/92* (2013.01); *H01L 2221/68318* (2013.01); *H01L 2221/68345* (2013.01); *H01L 2221/68359* (2013.01); *H01L 2221/68381* (2013.01); *H01L 2224/131* (2013.01); *H01L 2224/13111* (2013.01); *H01L 2224/13116* (2013.01); *H01L 2224/16227* (2013.01); *H01L 2224/16235* (2013.01); *H01L 2224/16237* (2013.01); *H01L 2224/32225* (2013.01); *H01L 2224/45144* (2013.01); *H01L 2224/45147* (2013.01); *H01L 2224/48091* (2013.01); *H01L 2224/48227* (2013.01); *H01L 2224/73204* (2013.01); *H01L 2224/73265* (2013.01); *H01L 2224/81005* (2013.01); *H01L 2224/8149* (2013.01); *H01L 2224/81444* (2013.01); *H01L 2224/81447* (2013.01); *H01L 2224/81815* (2013.01); *H01L 2224/83005* (2013.01); *H01L 2224/8385* (2013.01); *H01L 2224/83101* (2013.01); *H01L 2224/83104* (2013.01); *H01L 2224/85005* (2013.01); *H01L 2224/92125* (2013.01); *H01L 2224/92147* (2013.01); *H01L 2224/97* (2013.01); *H01L 2924/1533* (2013.01); *H01L 2924/15311* (2013.01); *H01L 2924/181* (2013.01)

(58) Field of Classification Search
USPC .......................................................... 174/251
See application file for complete search history.

(56) References Cited

U.S. PATENT DOCUMENTS

| | | | |
|---|---|---|---|
| 2013/0083503 A1* | 4/2013 | Lai | H01L 23/49894 361/783 |
| 2013/0180769 A1* | 7/2013 | Aoshima | B32B 7/02 174/258 |
| 2013/0258625 A1* | 10/2013 | Terui | H05K 1/115 361/774 |
| 2015/0090476 A1* | 4/2015 | Sun | H05K 3/0097 174/250 |

FOREIGN PATENT DOCUMENTS

| | | |
|---|---|---|
| JP | 2011-119501 | 6/2011 |
| JP | 2013-138115 | 7/2013 |

* cited by examiner

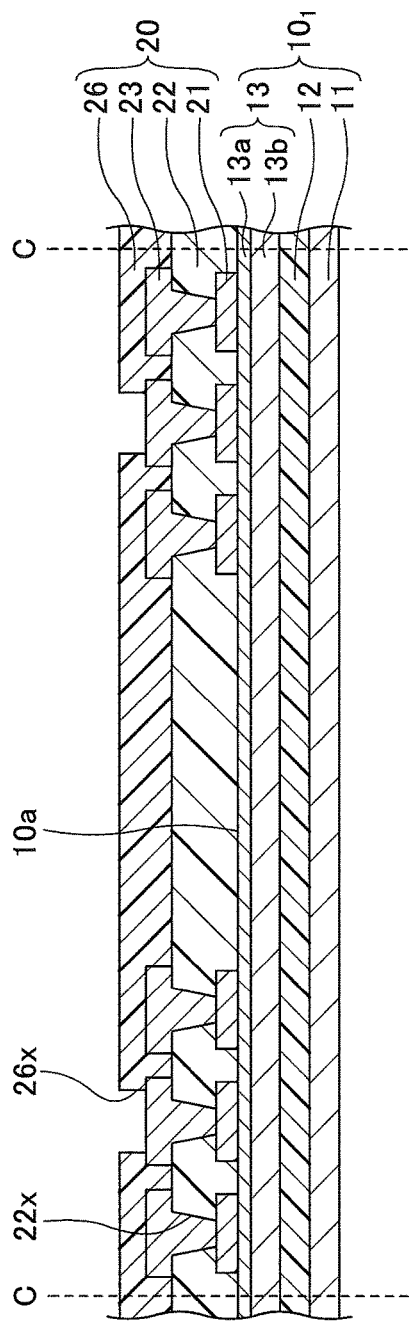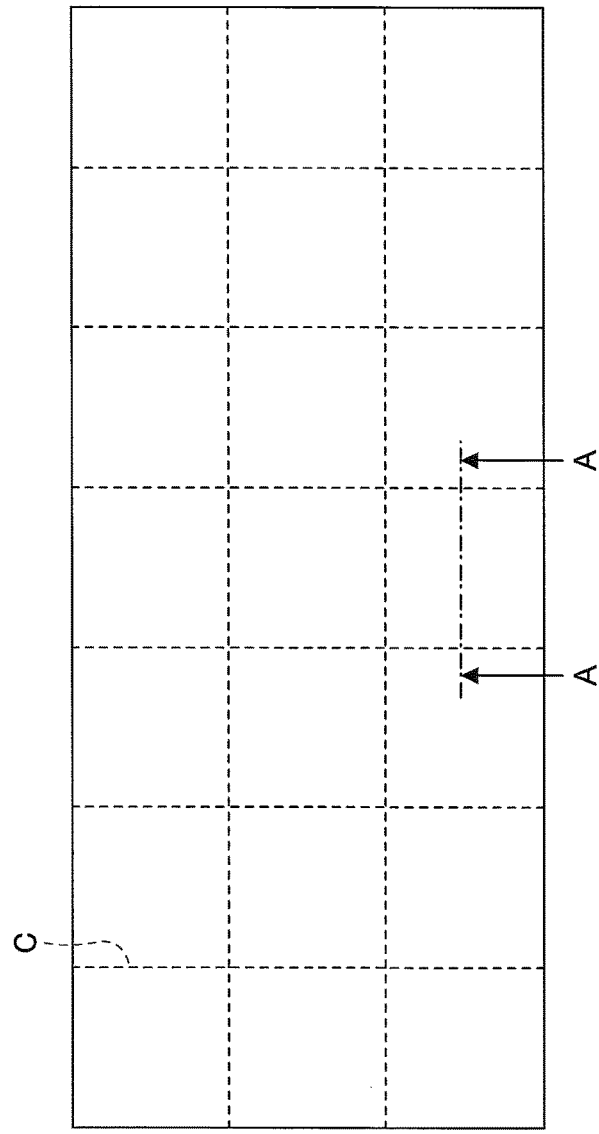
FIG.1A
FIG.1B

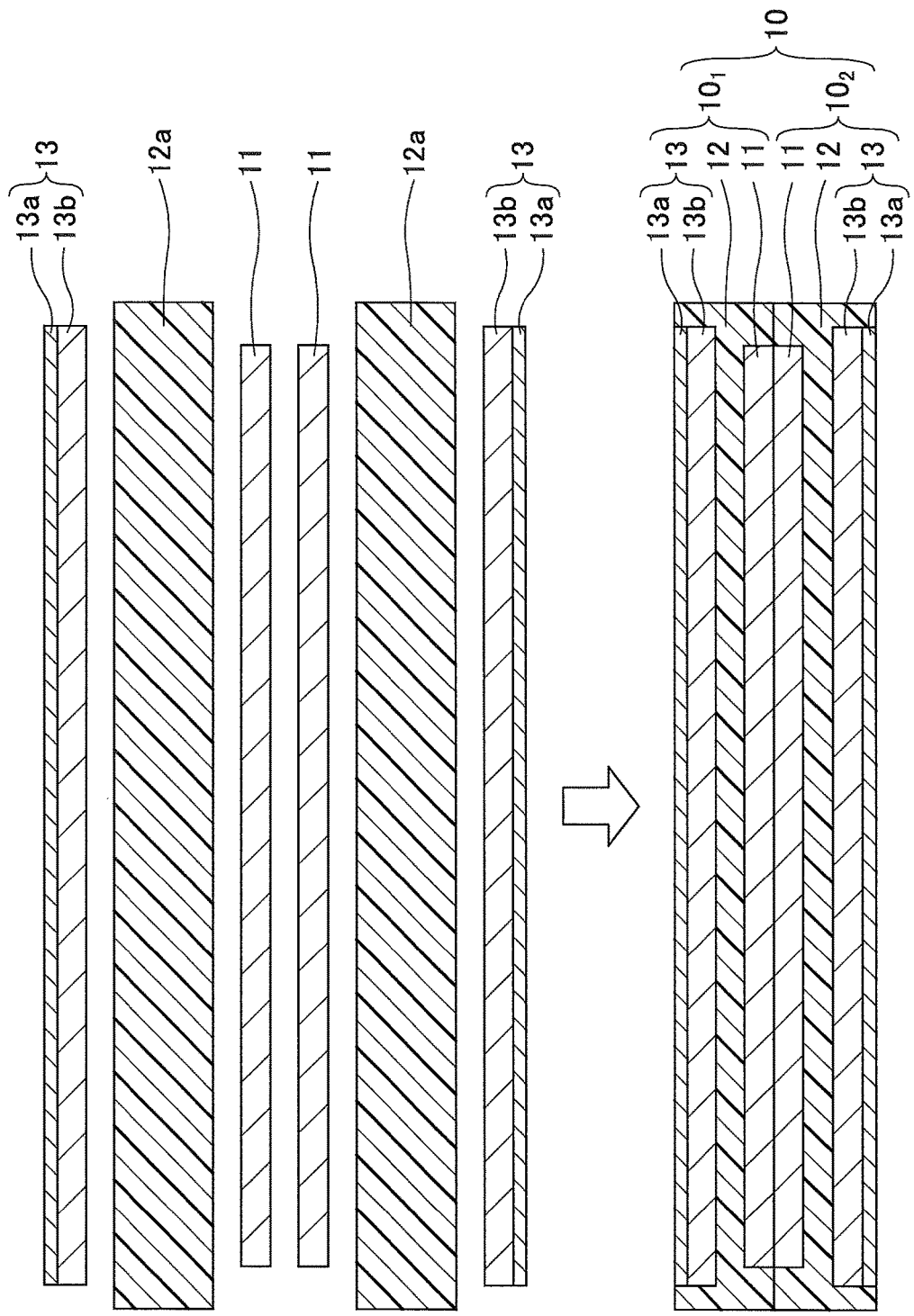

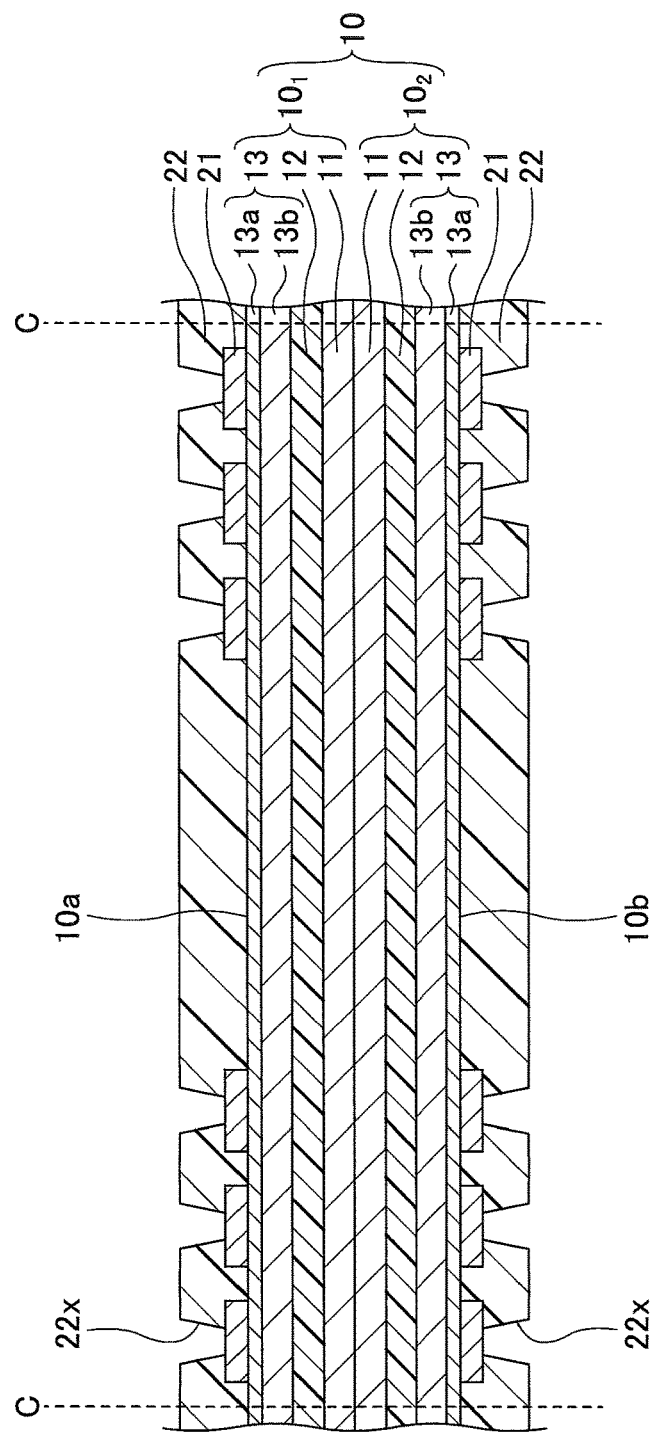

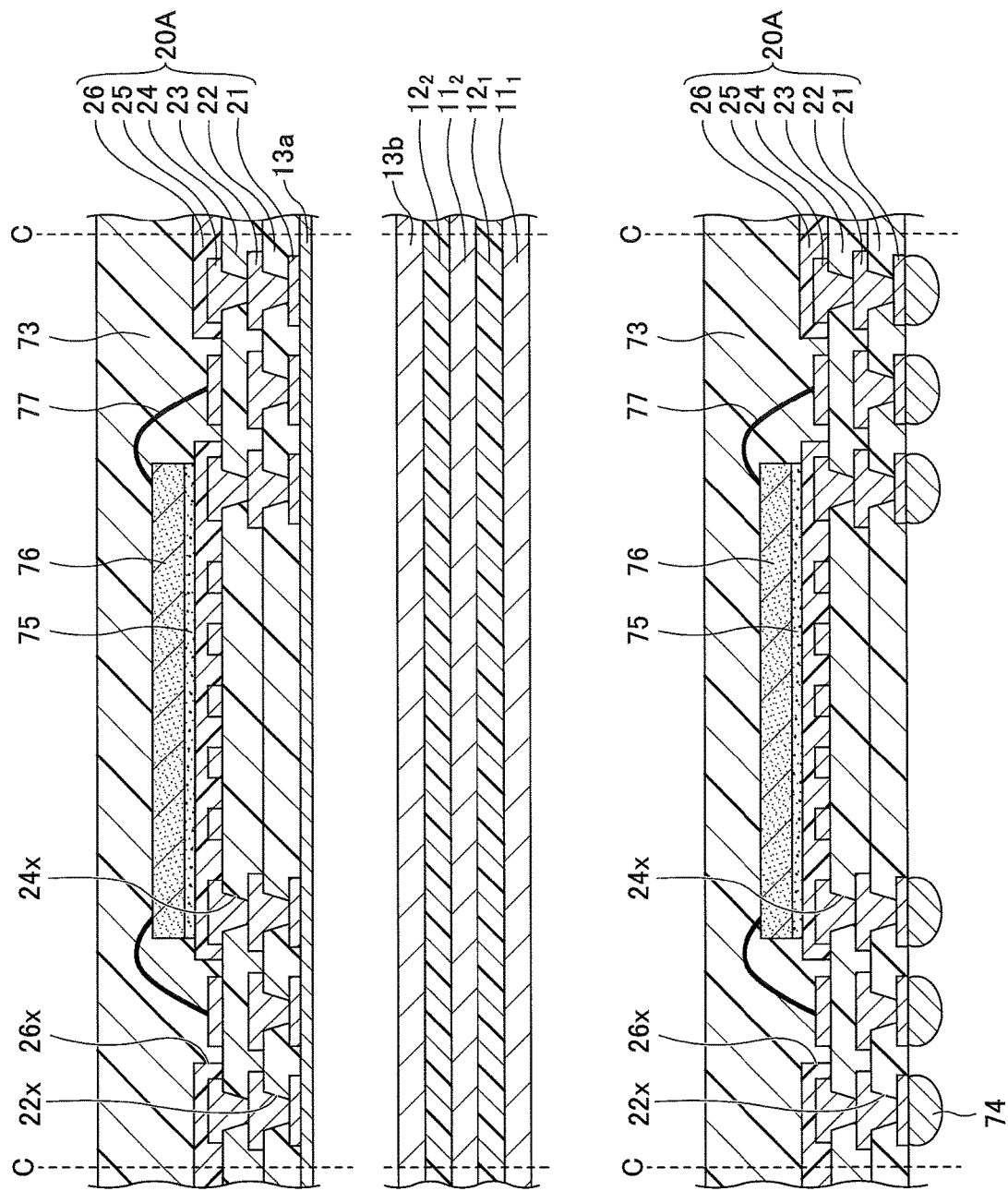

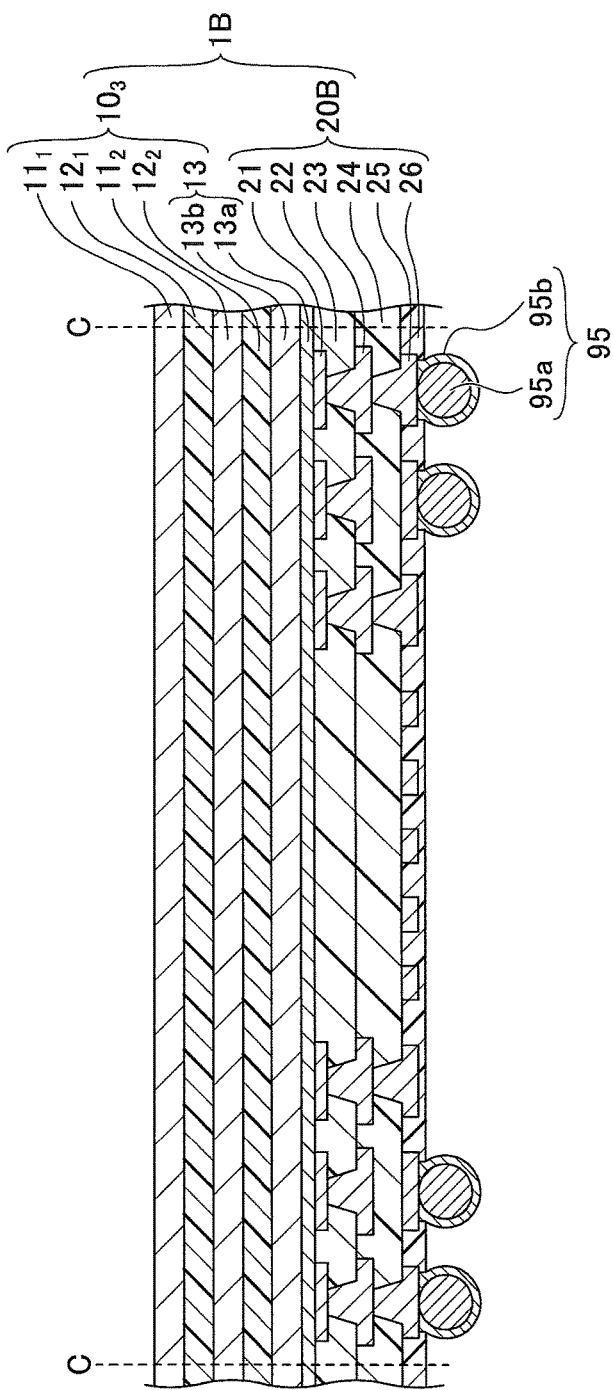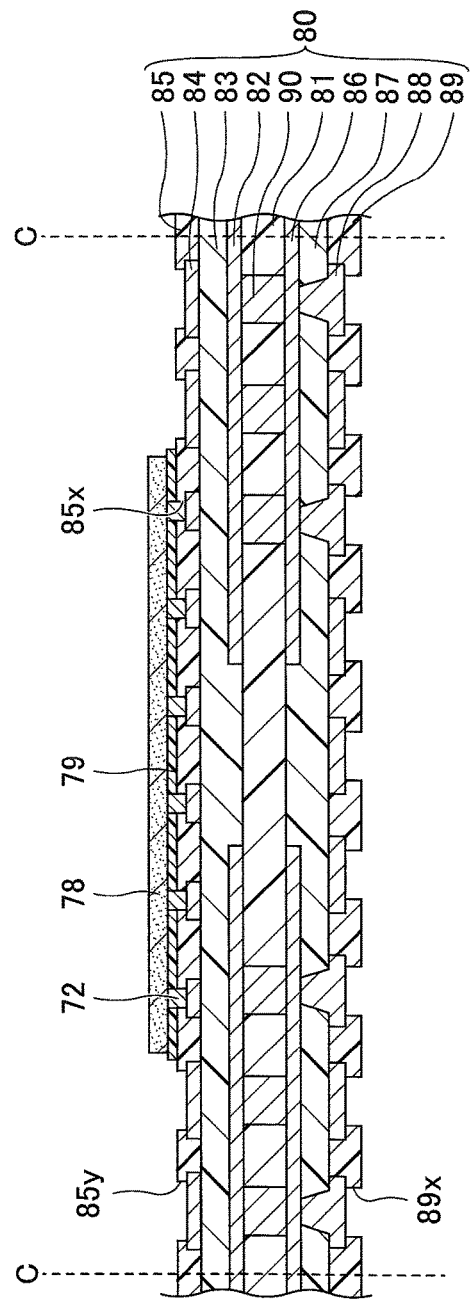
FIG.13A
FIG.13B

SUPPORT MEMBER, WIRING SUBSTRATE, METHOD FOR MANUFACTURING WIRING SUBSTRATE, AND METHOD FOR MANUFACTURING SEMICONDUCTOR PACKAGE

CROSS-REFERENCE TO RELATED APPLICATIONS

This application is based upon and claims the benefit of priority of the prior Japanese Patent Application No. 2014-156617 filed on Jul. 31, 2014, the entire contents of which are incorporated herein by reference.

FIELD

The embodiments discussed herein are related to a support member, a wiring substrate, a method for manufacturing the wiring substrate, and a method for manufacturing a semiconductor package.

BACKGROUND

As thickness reduction of a wiring substrates progresses, a wiring substrate that has two or three wiring layers can be formed with a thickness less than 100 μm. Because the rigidity of the substrate of such thin wiring substrate is low, the thin wiring substrate is difficult to handle during a manufacturing process. Therefore, to ensure the rigidity of the substrate, a wiring substrate having multiple wiring members layered on a support member is proposed.
Patent Document 1: Japanese Laid-Open Patent Publication No.: 2013-138115

However, with the conventional wiring substrate having multiple wiring members layered on a support member, the layer structure of the support member is not optimized for a wiring member. Thus, the support member may be thicker than required for the wiring member.

SUMMARY

According to an aspect of the invention, there is provided a wiring substrate including a support member, and a wiring member formed on one side of the support member. The support member includes multiple metal foils and at least one resin layer that are alternately layered, so that one of the multiple metal foils is provided as a first outermost layer on the one side of the support member and another one of the multiple metal foils is provided as a second outermost layer on another side of the support member. The first outermost layer includes a thick foil and a thin foil that is peelably adhered to the thick foil. The thick foil contacts at least the one resin layer. One surface of the thin foil faces an outer side of the support member. The wiring member includes multiple wiring layers and an insulating layer that are alternately layered on the thin foil. The number of the multiple metal foils and the number of the wiring layers are the same.

The object and advantages of the invention will be realized and attained by means of the elements and combinations particularly pointed out in the claims.

It is to be understood that both the foregoing generation description and the followed detailed description are exemplary and explanatory and are not restrictive of the invention as claimed.

BRIEF DESCRIPTION OF DRAWINGS

FIGS. 1A-1B are schematic diagrams illustrating a wiring substrate according to a first embodiment of the present invention;

FIGS. 10A-11 are schematic diagrams illustrating processes for manufacturing a semiconductor package according to the second embodiment of the present invention;

DESCRIPTION OF EMBODIMENTS

Figure 2B:
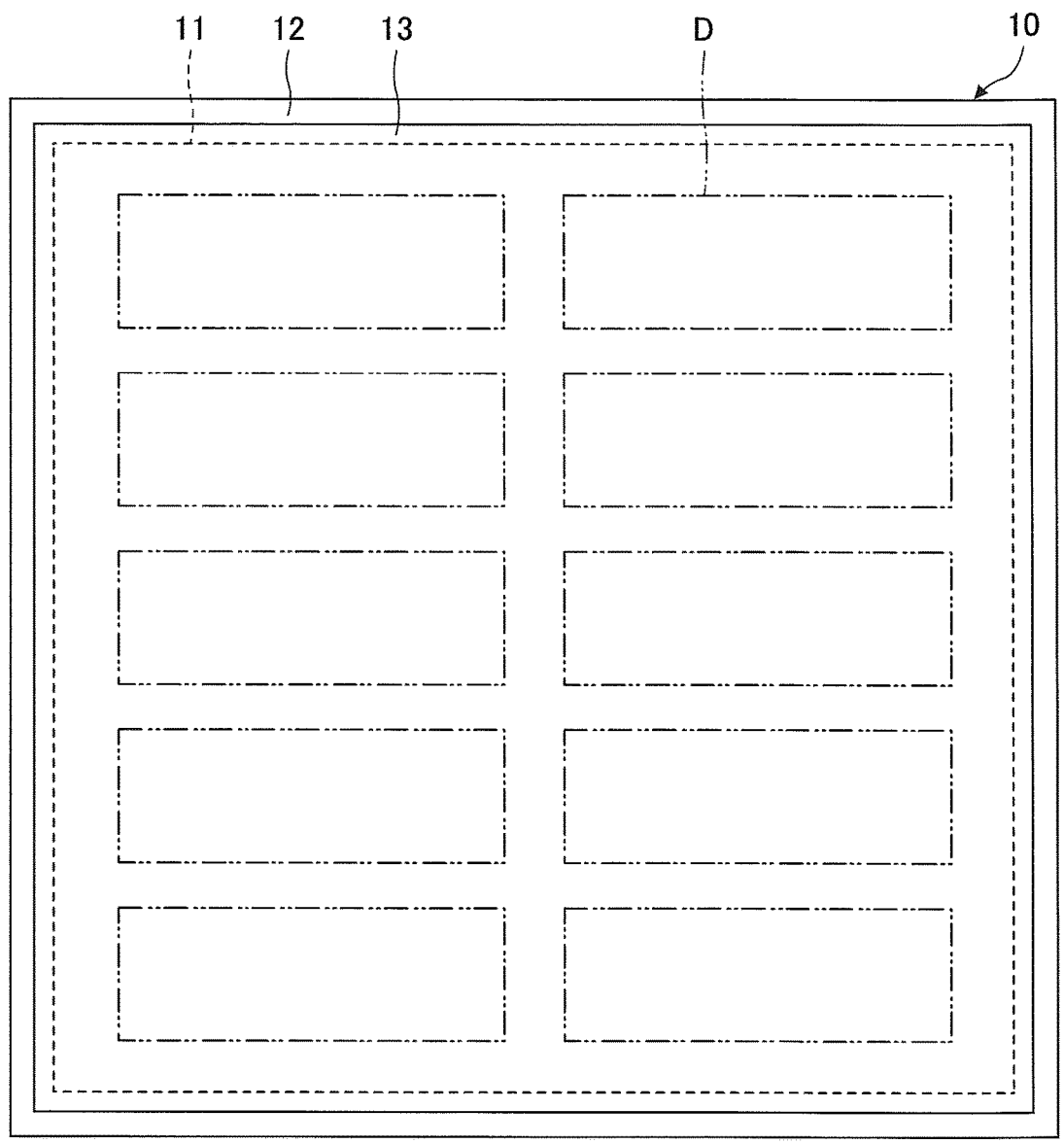
FIGS. 2A-4C are schematic diagrams illustrating processes for manufacturing a wiring substrate according to the first embodiment of the present invention.

In the following, embodiments of the present invention are described with reference to the accompanying drawings. In the drawings, like components/parts are denoted with like reference numerals and further explanation thereof may be omitted.

First Embodiment

<Structure of Wiring Substrate of First Embodiment>
First, a structure of a wiring substrate 1 according to a first embodiment of the present invention is described. FIGS. 1A and 1B are schematic diagrams illustrating the wiring substrate 1 of the first embodiment. FIG. 1B is a plan view of the wiring substrate 1. FIG. 1A is a cross-sectional view taken along line A-A of FIG. 1B.

With reference to FIGS. 1A and 1B, the wiring substrate 1 is a sheet-like wiring substrate having multiple regions surrounded by a broken line C. The wiring substrate 1 is to be removed from a support member after performing various processes on the wiring substrate 1 such as mounting of a semiconductor chip and forming an encapsulating resin. Then, finally, the wiring substrate 1 is cut along the broken line C, so that multiple individualized semiconductor packages are obtained. Although the wiring substrate 1 illustrated in the embodiment of FIGS. 1A and 1B includes regions 21 encompassed by the broken line C, the number of regions 21 included in the wiring substrate 1 is not limited to the regions 21 illustrated in FIGS. 1A and 1B.

For the sake of convenience, in this embodiment, the side positioned toward a solder resist layer 26 of the wiring substrate 1 (upper side in FIG. 1A) may be described as "upper side" or "one side" whereas the side positioned toward a copper foil 11 of the wiring substrate 1 (lower side in FIG. 1A) may be described as "lower side" or "other side". Further, a surface of each part (element) positioned toward the side of the solder resist layer 26 may be described as "upper surface" or "one surface" whereas a surface of each part (element) positioned toward the copper foil 11 may be described as "lower surface" or "other surface". However, the wiring substrate 1 may be used in an upside down state or positioned at a given angle. Further, a "plan view" refers to observing an object from a direction of a line normal to one surface 10a of the support member $10_1$, and a "plan-view shape" refers to a shape observed from a direction of a line normal to the one surface 10a of the support member $10_1$.

The wiring substrate 1 includes a support member $10_1$, and a wiring part 20 layered on the side of the one surface 10a of the support member $10_1$. The support member $10_1$ is formed having a metal foil and a resin layer alternately layered, so that one metal foil is provided as an outermost layer on the one side of the wiring substrate 1 and another metal foil is provided as an outermost layer on the other side of the wiring substrate 1. More specifically, the support member $10_1$ has a structure in which a copper foil 11, a resin layer 12, and a carrier-attached copper foil 13 are sequentially layered. The support member $10_1$ supports the wiring member 20 and functions to improve the strength of the entire wiring substrate 1 and reduce warping of the wiring substrate 1.

The thickness of the copper foil 11 is, for example, approximately 7 μm to 50 μm. The resin layer 12 may be, for example, a non-photosensitive thermosetting resin such an epoxy type resin or a polyimide type resin. The thickness of the resin layer 12 may be, for example, approximately 10 μm to 50 μm. The resin layer 12 may be a so-called prepreg having a thermosetting resin (e.g., epoxy type resin, polyimide type resin) impregnated beforehand in a woven or non-woven cloth made of glass fiber or an aramid fiber. It is preferable to use a prepreg as the resin layer 12 to ensure the strength of the wiring member 20 and reduce warping of the wiring member 20. The resin layer 12 may include a filler such as silica ($SiO_2$).

The carrier-attached copper foil 13 has a structure in which a thin foil 13a is peelably adhered on a thick foil (carrier foil) 13b by way of a peeling layer (not illustrated). The thick foil 13b may be formed of copper and have a thickness of, for example, approximately 10 μm to 50 μm. The thin foil 13a may also be formed of copper and have a thickness of, for example, 1.5 μm to 5 μm. The thick foil 13b is used as a supporting member for facilitating the handling of the thin foil 13a. The thick foil 13b is adhered to the copper foil 11 by way of the resin layer 12. The upper surface of the thin foil 13a serves as the one surface 10a of the support member $10_1$.

The wiring member 20 has a structure in which a wiring layer 21, an insulating layer 22, a wiring layer 23, and a solder resist layer 26 are sequentially layered. The wiring layer 21 includes a pad or a wiring pattern that is formed on the one surface 10a of the support member $10_1$. For example, copper (Cu) may be used as the material of the wiring layer 21. The thickness of the wiring layer 21 may be, for example, 5 μm to 20 μm.

The insulating layer 22 is formed on the one surface 10a of the support member $10_1$ to cover the wiring layer 21. The insulating layer 22 may be formed of, for example, an epoxy resin or a polyimide resin. The thickness of the insulating layer 22 may be, for example, approximately 10 μm to 50 μm. The insulating layer 22 may be a so-called prepreg having a thermosetting resin (e.g., epoxy type resin, polyimide type resin) impregnated beforehand in a woven or non-woven cloth made of glass fiber or an aramid fiber. It is preferable to use a prepreg as the insulating layer 22 to ensure the strength of the wiring member 20 and reduce warping of the wiring member 20. The insulating layer 22 may include a filler such as silica ($SiO_2$).

The wiring layer 23 that is formed on the one side of the insulating layer 22 is electrically connected to the wiring layer 21. The wiring layer 23 includes a via wiring that fills the inside of the via hole 22x that penetrates the insulating layer 22 and exposes the upper surface of the wiring layer 21. The wiring layer 23 also includes a wiring pattern formed on the upper surface of the insulating layer 22. The via hole 22x is an inverted circular truncated cone-shaped recess including an opening on a side of the solder resist layer 26 and a bottom surface formed by an upper surface of the wiring layer 21. The area of the opening on the side of the solder resist layer 26 is larger than the area of the bottom surface of the recess. The diameter of the opening of the via hole 22x may be, for example, approximately 50 μm to 100 μm. The material of the wiring layer 23 and the thickness of the wiring pattern of the wiring layer 23 may be the same as those of the wiring layer 21.

The solder resist layer 26 is formed on the upper surface of the insulating layer 22 to allow the wiring layer 23 to be selectively exposed from the solder resist layer 26. For example, a photosensitive insulating resin having a phenol type resin or polyimide type resin as a main component may be used as the material of the solder resist layer 26. Alternatively, a non-photosensitive insulating resin having an epoxy type resin or a polyimide type resin as a main component may be used as the material of the solder resist layer 26. The solder resist layer 26 may include a filler such as silica ($SiO_2$) or alumina.

The solder resist layer 26 includes an opening 26x. A part of the wiring layer 23 is exposed at a bottom part of the opening 26x. The wiring layer 23 that is exposed at the bottom part of the opening 26x functions as an electronic device mounting pad to be electrically connected to an electronic device such as a semiconductor chip.

A surface processed layer (not illustrated) may be formed on the upper surface of the wiring layer 23 that is exposed at the bottom part of the opening 26x. For example, the surface processed layer may be a gold (Au) layer, a nickel/gold (Ni/Au) layer (i.e. a metal layer including a Ni layer and an Au layer that are layered in this order), a nickel/palladium/gold (Ni/Pd/Au) layer (i.e. a metal layer including a Ni layer, a Pd layer, and an Au layer that are layered in this order). The surface processed layer may be formed by performing an oxidization resistance process (e.g., OSP (Organic Solderability Preservative)) on the upper surface of the wiring layer 23 exposed at the bottom part of the opening 26x. The surface processed layer formed by the OSP process is an organic coating film made of, for example, an azole compound or an imidazole compound.

In this embodiment, the number of layers of the metal foil (copper foil) included in the support member $10_1$ and the number of wiring layers included in the wiring member 20 are the same. That is, the number of layers of the metal foils constituting the support member $10_1$ is two, in which the first layer may be the copper foil 11 and the second layer may be the carrier-attached copper foil 13. The number of wiring layers constituting the wiring member 20 is also two, in which the first layer may be the wiring layer 21 and the second layer may be the wiring layer 23. It is to be noted that, technically, the carrier-attached copper foil 13 includes the thin foil 13a and the thick foil 13b. However, from the standpoint of evaluating strength and warping, it is reasonable to consider the carrier-attached copper foil 13 as a single layer.

By forming the wiring substrate 1 so that the number of layers of metal foils (copper foils) included in the support member $10_1$ is the same as the number of wiring layers included in the wiring member 20 (i.e., both the support member $10_1$ and the wiring member 20 having two layers), the wiring substrate 1 is formed to have a vertically symmetrical layered structure. Owing to this vertically symmetrical layered structure, the wiring substrate 1 can be resistant to warping. Further, similar to the layered structure of the wiring member 20, the support member $10_1$ also has a layered structure including a resin layer and a metal foil. Therefore, even in a case where the support member $10_1$ is relatively thin, the support member $10_1$ can attain a certain amount of strength.

By adjusting the thickness of each layer included in the support member $10_1$ and the wiring member 20 so that the thickness of the entire support member $10_1$ and the thickness of the entire wiring member 20 are substantially the same, the balance between the upper side of the wiring substrate 1 and the lower side of the wiring substrate 1 can be improved. Thereby, the structure of the wiring substrate 1 can be resistant to warping.

Even in a case where the rigidity of the wiring substrate 1 is ensured, the possibility of warping of the wiring substrate 1 becomes high due to the difference of the physical properties (e.g., thermal expansion coefficient) between the support member $10_1$ and the wiring member 20 when the difference between the thickness of the entire support member $10_1$ and the thickness of the entire wiring member 20 becomes large. Therefore, the thickness of the entire support member $10_1$ and the thickness of the entire wiring member 20 is to be as even as possible. For example, the difference between the thickness of the entire support member $10_1$ and the thickness of the entire wiring member 20 is preferably less than or equal to ±50%, and more preferably less than or equal to ±20%.

As the wiring substrate 1 becomes thinner, the thickness of the entire support member $10_1$ is to be greater than or equal to the thickness of the entire wiring member 20 for ensuring the rigidity of the wiring substrate 1. From the aspect of warping prevention, the difference between the thickness of the entire support member $10_1$ and the thickness of the entire wiring member 20 is also preferably less than or equal to +50%, and more preferably less than or equal to +20%.

From the aspect of warping prevention, insulating resins having the same compositions are preferred to be used for the resin layer 12 of the support member $10_1$ and the insulating layer 22 of the wiring member 20.

<Method for Manufacturing Wiring Substrate and the Like of the First Embodiment>

Next, a method for manufacturing a wiring substrate according to the first embodiment of the present invention is described. Further, a method for manufacturing a semiconductor package including the wiring substrate 1 having a semiconductor chip mounted thereon is described. FIGS. 2A-4C are schematic diagrams illustrating processes for manufacturing the wiring substrate 1 of the first embodiment. FIGS. 5A-6C are schematic diagrams illustrating processes for manufacturing the semiconductor package of the first embodiment.

In the processes illustrated in FIGS. 2A and 2B, a support body 10 having the support member $10_1$ formed on another support member $10_2$ (second layered body) is fabricated. FIG. 2A is a cross-sectional view of the support body 10. FIG. 2B is a plan view of the support body 10. In this embodiment, a prepreg is used as the resin layer 12. However, depending on the strength that is desired for the support body 10, the resin layer 12 may be formed of a resin that does not include a glass cloth or the like. It is to be noted that the support member $10_1$ may be referred as the first layered body of the support body 10, and the support member $10_2$ may be referred as the second layered body of the support body 10.

For fabricating the support body 10, two prepregs 12a are prepared. Each prepreg 12a is a woven fabric (e.g., woven glass fabric, woven aramid fabric) or a non-woven fabric (e.g., non-woven glass fabric, non-woven aramid fabric) that is impregnated in a resin such as an epoxy type resin. The prepreg 12a is in a semi-cured (B-stage) state. The plan-view shape of the prepreg 12a may be a rectangular shape having a dimension of approximately 400 mm to 500 mm in both length and width. The thickness of the prepreg 12a may be, for example, approximately 10 µm to 50 µm.

Further, two copper foils and two carrier-attached copper foils 13 including the thin foil 13a and the thick foil 13b are prepared. The plan-view shape of the carrier-attached copper foil 13 may have a rectangular shape that is slightly smaller than the plan-view shape of the prepreg 12a. Further, the plan-view shape of the copper foil 11 may have a rectangular shape that is slightly smaller than the plan-view shape of the carrier-attached copper foil 13. The dimensions such as the thicknesses of the copper foil 11 and the carrier-attached copper foil 13 are the same as those described above.

Then, as illustrated in the area above the arrow of FIG. 2A, the carrier-attached copper foil 13 that is to be the lowermost layer of the support member $10_2$ is positioned in a state having the thin foil 13a faced downward. Then, in this state, the prepreg 12a and the copper foil 11 that form the support member $10_2$ are sequentially layered on the thick foil 13b of the carrier-attached copper foil 13. Then, the copper foil 11 and the prepreg 12a that form the support member $10_1$ are sequentially layered on the copper foil 11 of the support member $10_2$. Then, the carrier-attached copper foil 13 that is to form the support member $10_1$ is layered on the prepreg 12a of the support member $10_1$ in a state having the thin foil 13a faced upward. It is to be noted that the aforementioned members are sequentially layered to have their centers substantially matched to each other.

Then, each of the prepregs 12a is cured by exerting pressure from the carrier-attached copper foil 13 of the support member $10_1$ to the side of the carrier-attached copper foil 13 of the support member $10_2$ in a state where each prepreg 12a is heated at a temperature of approximately 190° C. to 230° C. in a vacuum atmosphere. Thereby, as illustrated in the area below the arrow of FIG. 2A, each prepreg 12a is cured to become the resin layer 12, respectively. Accordingly, the support body 10 having the support member $10_2$ and the support member $10_1$ layered on the support member $10_2$ is fabricated.

In the support member $10_1$, the carrier-attached copper foil 13 is adhered to the resin layer 12 by being embedded in the upper surface of the resin layer 12 whereas the copper foil 11 is adhered to the resin layer 12 by being embedded in the lower surface of the resin layer 12. The upper surface of the carrier-attached copper foil 13 (upper surface of the thin foil 13a) is exposed from the upper surface of the resin layer 12, and the side surface of the carrier-attached copper foil 13 is covered by the resin layer 12. The upper surface of the thin foil 13a of the carrier-attached copper foil 13 may be flush with the upper surface of the resin layer 12. The lower surface of the copper foil 11 is exposed from the lower surface of the resin layer 12, and the side surface of the copper foil 11 is covered by the resin layer 12. The lower surface of the copper foil 11 may be flush with the lower surface of the resin layer 12.

For the sake of convenience, the support member $10_2$ is indicated with a reference numeral different from the reference numeral of the support member $10_1$. However, the support member $10_2$ has the same layer configuration as the support member $10_1$ and is different from the support member $10_1$ in that the support member $10_2$ is vertically inverted relative to the support member $10_1$. Although the lower surface (exposed surface) of the copper foil 11 of the support member $10_1$ and the upper surface (exposed surface) of the copper foil 11 of the support member $10_2$ contact each other, the lower surface of the copper foil 11 of the support member $10_1$ and the upper surface of the copper foil 11 of the support member $10_2$ are not adhered to each other. An outer peripheral part of an exposed surface of the resin layer 12 of the support member $10_1$ surrounding the lower surface of the copper foil 11 of the support member $10_1$ (area having no copper foil 11 formed thereon) and an outer peripheral part of an exposed surface of the resin layer 12 of the support member $10_2$ surrounding the upper surface of the copper foil 11 of the support member $10_2$ (area having no copper foil 11 formed thereon) are adhered to each other.

In FIG. 2B, each region being surrounded by the double-dot dash line D is a region that is to become the sheet-like wiring substrate 1. That is, each region being surrounded by the double-dot dash line D corresponds to a single wiring substrate 1 that is individualized from multiple wiring substrates 1 obtained by cutting the support body 10 along the double-dot dash line D (see FIGS. 1A and 1B) in the final stages of the manufacturing process. Each region being surrounded by the double-dot dash line D is arranged more inward than an outer edge of the copper foil 11 from a plan view. Although the embodiment of FIG. 2B is illustrated to have ten regions surrounded by the double-dot dash line D, the number of regions is not limited to ten.

The following processes are described by using cross-sectional views illustrating a region that is to become a semiconductor package (corresponding to the region surrounded by the broken line C in FIGS. 1A and 1B) inside the region corresponding to a single wiring substrate 1 obtained by individualizing the regions surrounded by the double-dot dash line D of FIG. 2B in the final stages of the manufacturing process.

In the processes illustrated in FIGS. 3A to 4B, wiring layers and insulating layers are alternately layered on each of the one and the other surfaces 10a, 10b of the support body 10 (i.e., on each of the support member $10_1$ and the support member $10_2$) to fabricate the wiring member 20. The wiring member 20 on the side of the one surface 10a of the support body 10 is fabricated, so that the number of layers of metal foils included in the support member $10_1$ and the number of wiring layers included in the wiring member 20 are the same. Similarly, the wiring member 20 on the side of the other surface 10b of the support body 10 is fabricated, so that the number of layers of metal foils included in the support member $10_2$ and the number of wiring layers included in the wiring member 20 are the same.

Figure 3A:
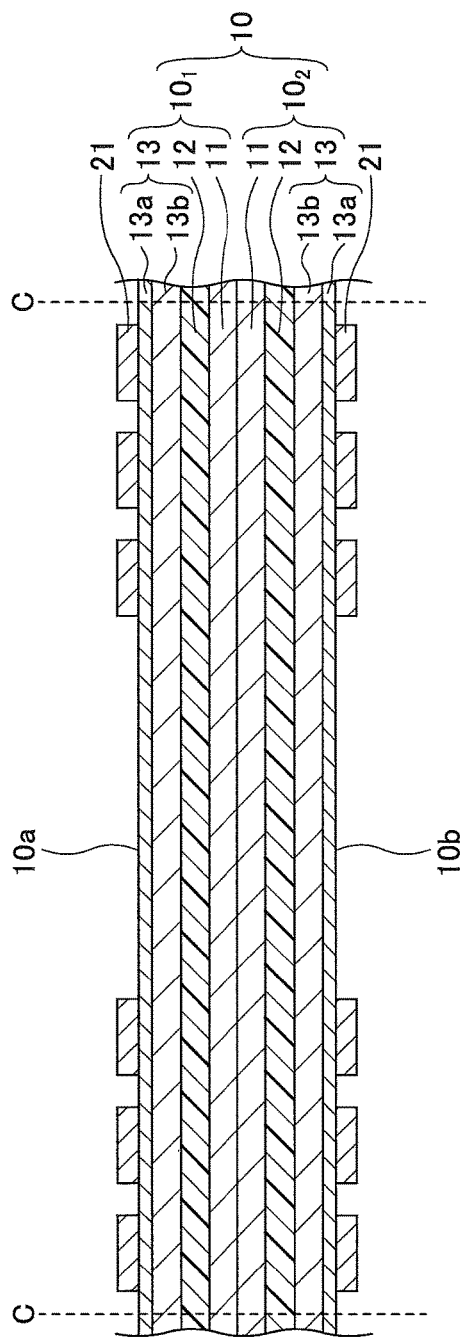

First, in the process illustrated in FIG. 3A, a wiring layer 21 is formed on each of the one and the other surfaces 10a, 10b of the support body 10 (support members $10_1$, $10_2$). More specifically, a resist layer including an opening (s) corresponding to the wiring layer 21 is formed on each of the one and the other surfaces 10a, 10b of the support body 10 by using, for example, a dry resist film. Then, the wiring layer 21 is formed in the opening that exposes the one and the other surfaces 10a, 10b of the support body 10. The wiring layer 21 is formed by performing, for example, an electroplating method using the carrier-attached copper film 13 as a power-feeding layer.

For example, copper (Cu) may be used as the material of the wiring layer 21. Further, a gold (Au) layer may formed on the side of the wiring layer 21 that contacts the carrier-attached copper foil 13, and then a palladium (Pd) layer, a nickel (Ni) layer, or a copper (Cu) layer may be formed on the gold layer. The thickness of the wiring layer 21 may be, for example, approximately 5 μm to 20 μm. After the wiring layer 21 is formed, the resist layer is removed.

Figure 3B:
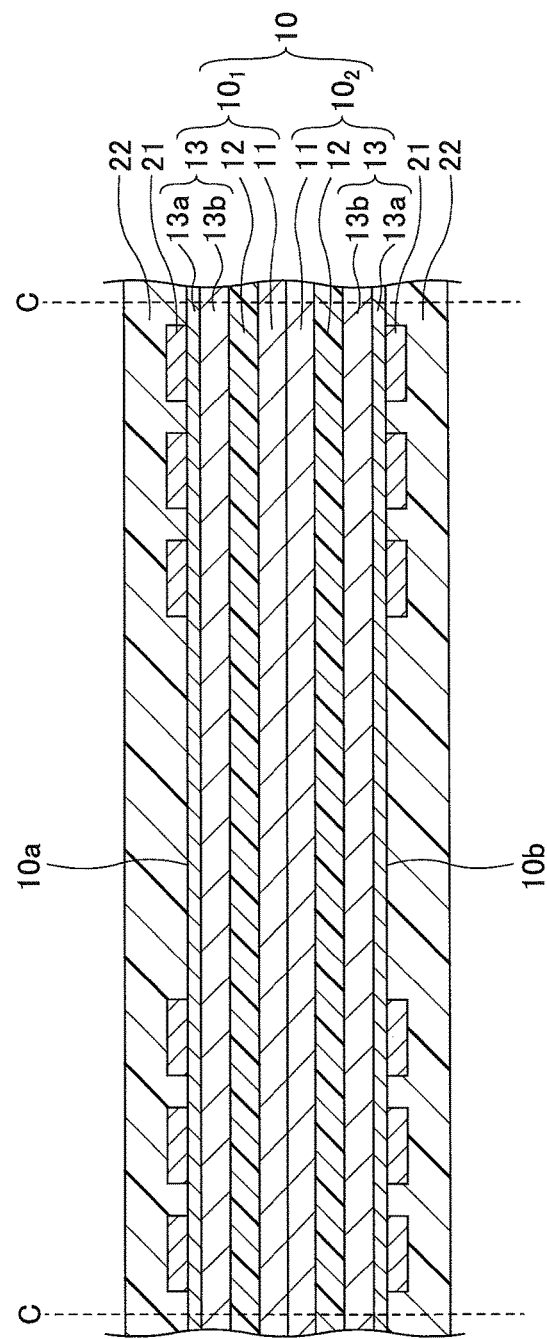

Then, in the process illustrated in FIG. 3B, an insulating layer 22 is formed on each of the on the one and the other surfaces 10a, 10b of the support body 10 to cover the wiring layer 21. For example, a film-like non-photosensitive insulating resin (e.g., thermosetting resin) having an epoxy type resin or a polyimide type resin as a main component may be used as the material of the insulating layer 22. A so-called prepreg may be used as the insulating layer 22. The prepreg may be a woven fabric (e.g., woven glass fabric, woven aramid fabric) or a non-woven fabric (e.g., non-woven glass fabric, non-woven aramid fabric) that is impregnated in a thermosetting resin such as an epoxy type resin. The thickness of the insulating layer 22 may be, for example, approximately 10 μm to 50 μm. The insulating layer 22 may include a filler such as silica ($SiO_2$).

More specifically, a film-like insulating resin in an uncured state is laminated on each of the one and the other surfaces 10a, 10b of the support body 10 to cover the wiring layer 21. Then, the laminated insulating resin is cured by heating the laminated insulating resin to a temperature greater than or equal to a thermosetting temperature while exerting pressure to the laminated insulating resin. Thereby, the insulating layer 22 is formed. By laminating the insulating resin in a vacuum atmosphere, the forming of voids can be prevented. Alternatively, the insulating layer 22 may be formed by applying a liquid or paste-like thermosetting resin (e.g., epoxy type resin, polyimide type resin) and curing the thermosetting resin.

By roughening the surface of the wiring layer 21 before the forming of the insulating layer 22, the adhesiveness between the wiring layer 21 and the insulating layer 22 can be increased. The roughening of the surface of the wiring layer 21 may be performed by a wet-etching method using formic acid.

Then, in the process illustrated in FIG. 3C, a via hole 22x penetrating the insulating layer 22 and exposing the surface of the wiring layer 21 is formed in the insulating layer 22. The via hole 22x may be formed by using, for example, a laser processing method using a $CO_2$ laser or the like. After forming the via hole 22x with the laser processing method, it is preferable to perform a desmearing process to remove residual resin adhered to the surface of the wiring layer 21 that is exposed at the bottom part of the via hole 22x.

The via hole 22x is a recess including an opening on a side of the solder resist layer 26 and a bottom surface formed by the surface of the wiring layer 21. The area of the opening on the side of the solder resist layer 26 is larger than the area of the bottom surface of the recess. For example, in a case where the openings on both sides of the via hole 22x are circular shapes, the via hole 22x is a recess having a circular cone shape or an inverted circular truncated cone shape. In this case, the diameter of the opening of the via hole 22x on the side of the solder resist layer 26 may be, for example, approximately 50 μm to 100 μm.

Figure 4A:
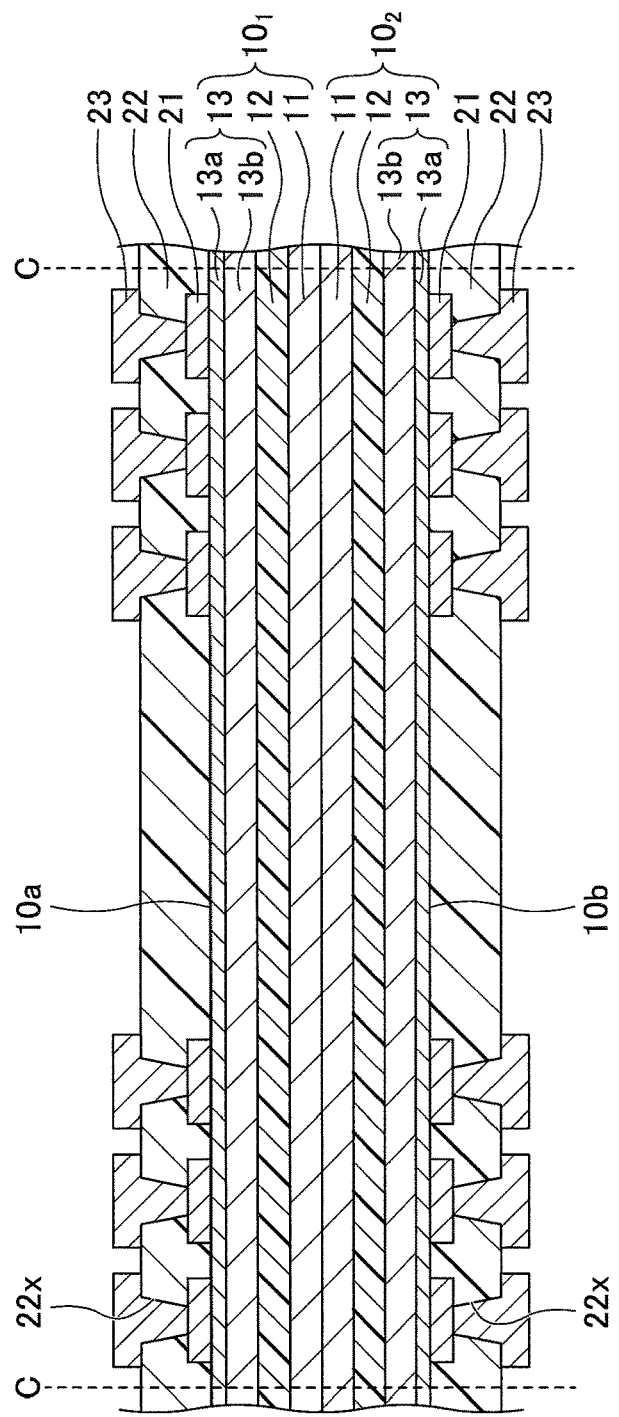

Then, in the process illustrated in FIG. 4A, a wiring layer 23 is formed on each insulating layer 22. The wiring layer 23 includes a via wiring filled in the via hole 22x and a wiring pattern formed on the insulating layer 22. The wiring layer 23 is electrically connected to the wiring layer 21 exposed at the bottom of the via hole 22x. For example, copper (Cu) may be used as the material of the wiring layer 23. The thickness of the wiring pattern included in the wiring layer 23 may be, for example, approximately 5 μm to 20 μm. The wiring layer 23 may be formed by using various methods such as a semi-additive method or a subtractive method.

For example, in a case of using the semi-additive method for forming the wiring layer 23, first, a seed layer (not illustrated) made of copper (Cu) or the like is formed by using an electroless plating method or a sputtering method. The seed layer is formed on the surface of the wiring layer 21 exposed at the bottom of the via hole 22x and the entire surface of the insulating layer 22 including the inner wall surface of the via hole 22x. Then, a resist layer (not illustrated) including an opening corresponding to the wiring layer 23 is formed on the seed layer. Then, an electroplating layer (not illustrated) made of copper (Cu) or the like is formed in the opening of the resist layer. Then, after the resist layer is removed, the electroplating layer is used as a mask to remove a part of the seed layer that is not covered by the electroplating layer. Thereby, the wiring layer 23 having the electroplating layer layered on the seed layer is formed.

Figure 4B:
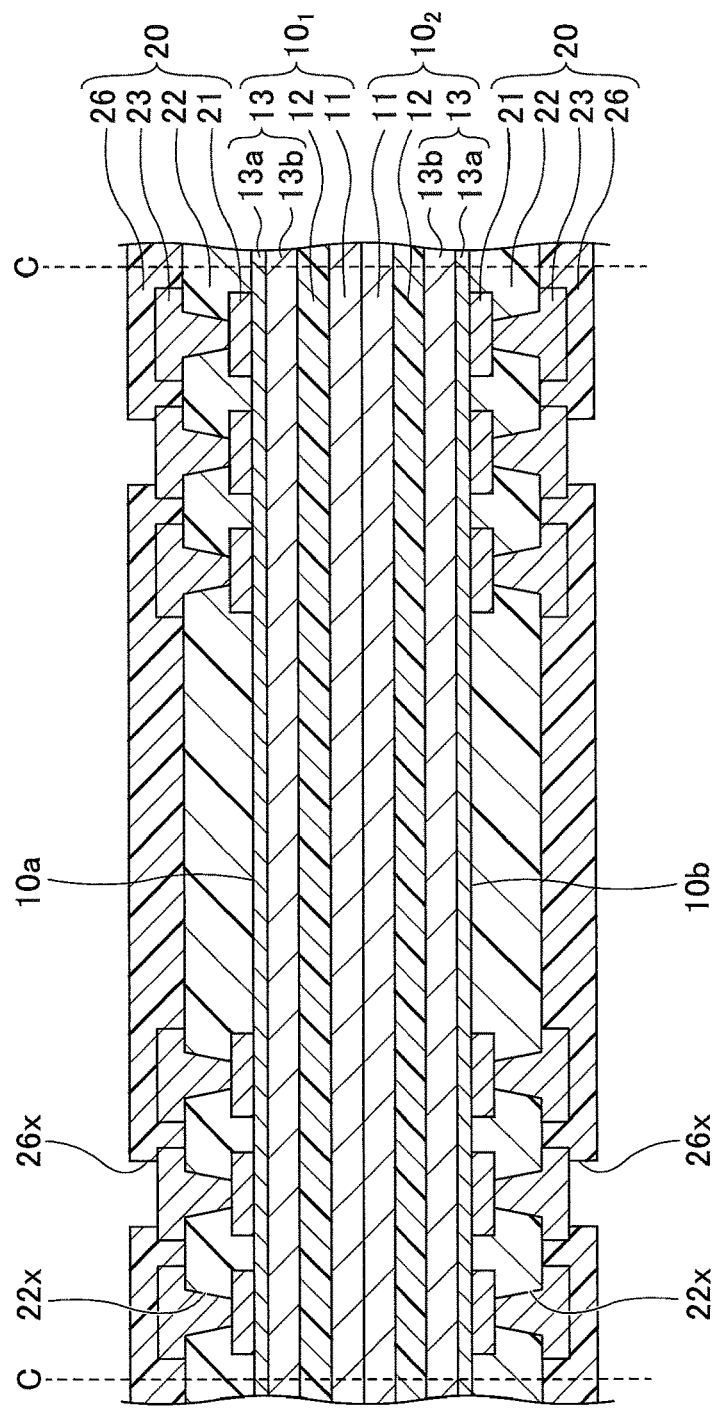

Then, in the process illustrated in FIG. 4B, the solder resist layer 26 that covers the wiring layer 23 is formed on each insulating layer 22. For example, a liquid or paste-like photosensitive insulating resin having a phenol type resin or a polyimide type resin as a main component may be used as the material of the solder resist layer 26. The photosensitive resin may be applied on each insulating layer 22 to cover the wiring layer 23 by using a screen-printing method, a roll-coating method, or a spin-coating method. Alternatively, a film-like photosensitive insulating resin may be laminated on each insulating layer 22 to cover the wiring layer 23.

Then, an opening 26x is formed in the solder resist layer 26 by exposing and developing the applied or laminated photosensitive insulating resin (photolithography method). In a case where a non-photosensitive insulating resin (thermosetting resin) having an epoxy type resin or a polyimide type resin as a main component is used as the solder resist layer 26, the opening 26x may be formed by, for example, a laser processing method or a blasting method. Thereby, a part of the wiring layer 23 can be exposed at the bottom of the opening 26x. The wiring layer 23 exposed at the bottom of the opening 26x may function as an electronic component mounting pad to be electrically connected to an electronic device such as a semiconductor chip.

A surface processed layer may be formed on the surface of the wiring layer 23 exposed at the bottom of the opening 26x. An example of the surface processed layer may be the surface processed layer described above. By roughening the surface of each wiring layer 23 before forming the solder resist layer 26, the adhesiveness between the wiring layer 23 and the solder resist layer 26 can be increased. Therefore, it is preferable to roughen the surface of the wiring layer 23 before forming the solder resist layer 26. The roughening of the surface of the wiring layer 23 may be performed by a wet-etching method using formic acid.

By performing the process illustrated in FIG. 4B, the wiring member 20 is formed on each of the one and the other surfaces 10a, 10b of the support body 10.

Figure 4C:
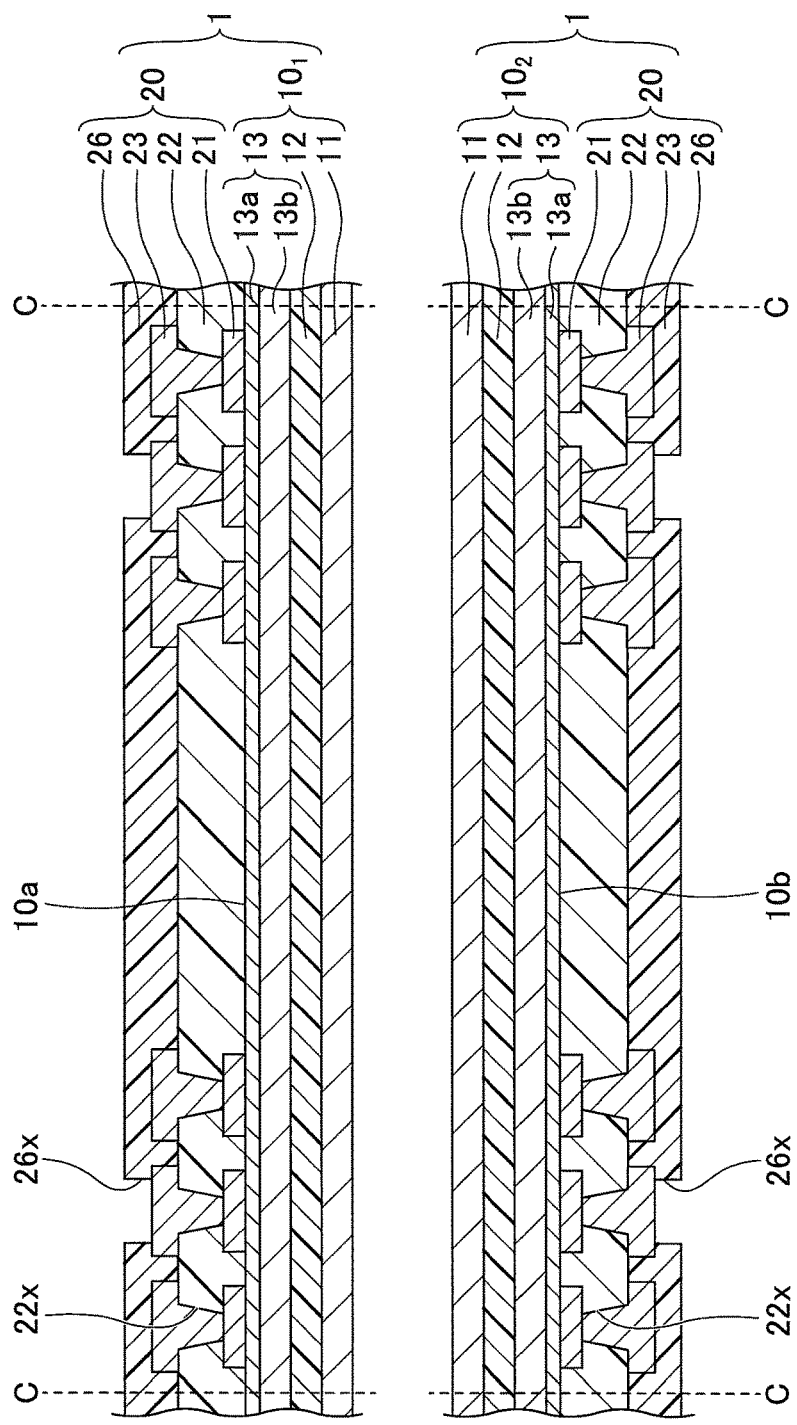

Then, in the process illustrated in FIG. 4C, sheet division is performed to fabricate multiple wiring substrates 1. The term "sheet division" refers to a process of separating the support member $10_1$ and the support member $10_2$ to fabricate one wiring substrate 1 having the wiring member 20 layered on the support member $10_1$ and another wiring substrate 1 having the wiring member 20 layered on the support member $10_2$.

In performing the sheet division, the support body 10 and the wiring member 20 layered on each side of the support body 10 are cut along the double-dot dash line D of FIG. 2D in the thickness direction by performing a routing process or the like. In FIG. 2B, each region being surrounded by the double-dot dash line D is arranged more inward than an outer edge of the copper foil 11 from a plan view. That is, each region being surrounded by the double-dot dash line D is arranged more inward than an adhering part between the support member $10_1$ and the support member $10_2$ (a contacting area between an exposed surface of the resin layer 12 of the support member $10_1$ surrounding the lower surface of the copper foil 11 of the support member $10_1$ and an exposed surface of the resin layer 12 of the support member $10_2$ surrounding the upper surface of the copper foil 11 of the support member $10_2$).

Accordingly, each sheet is separated from the adhering part between the support member $10_1$ and the support member $10_2$ by the sheet division process. Thereby, each divided sheet becomes a state in which the lower surface of the copper foil 11 of the support member $10_1$ and the upper surface of the copper foil 11 of the support member $10_2$ are only contacting each other. As a result, the support member $10_1$ and the support member $10_2$ can be easily divided at the part where the copper foils 11 contact each other. Thus, multiple wiring substrates (in this embodiment, twenty wiring substrates) 1 are fabricated.

As described above, for the sake of convenience, the support member $10_1$ and the support member $10_2$ are indicated with different reference numerals. However, the support member $10_1$ and the support member $10_2$ have the same layer configuration. Therefore, the wiring substrate 1 having the wiring member 20 layered on the support member $10_1$ and the wiring substrate 1 having the wiring member 20 layered on the support member $10_2$ are the same.

Figure 5A:
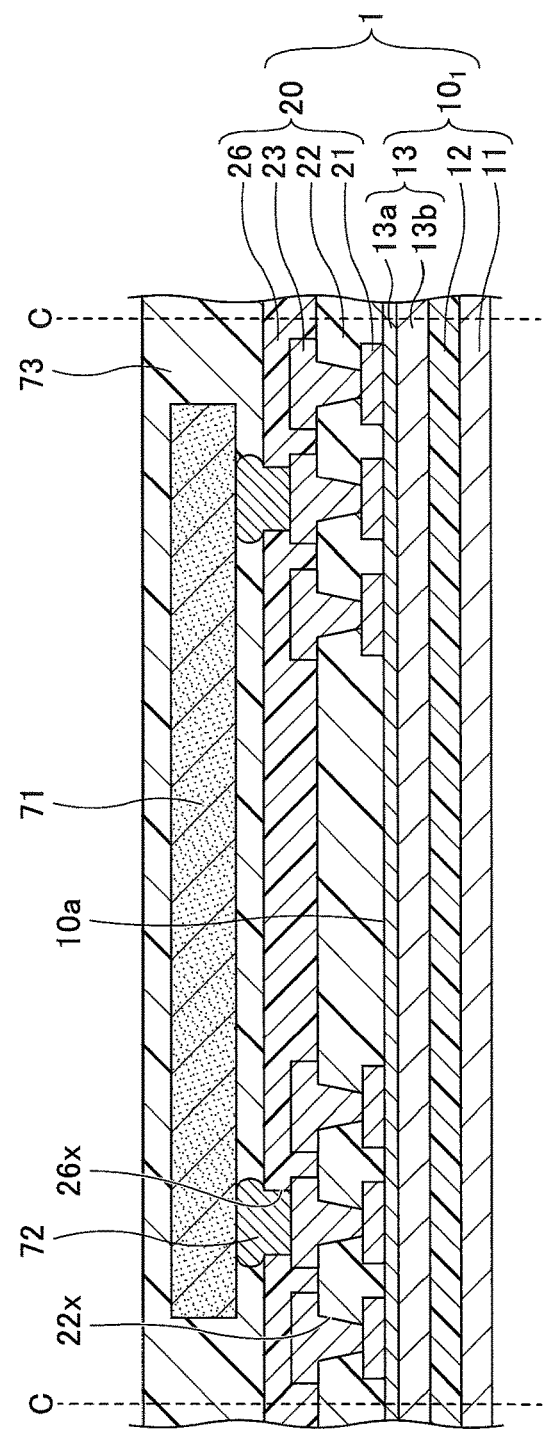
FIGS. 5A-6C are schematic diagrams illustrating processes for manufacturing a semiconductor package according to the first embodiment of the present invention.

Then, in the process illustrated in FIG. 5A, a semiconductor chip 71 is flip-chip bonded to the wiring member 20 of the wiring substrate 1 by way of a bump 72. More specifically, the wiring layer 23 exposed from the opening 26x of the wiring substrate 1 and a pad (not illustrated) of the semiconductor chip 71 are bonded by way of the bump 72 by performing a reflow process or the like. For example, a solder ball may be used as the bump 72. For example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu) may be used as the material of the bump 72. An underfill resin may be supplied between the semiconductor chip 71 and the wiring member 20. Then, an encapsulating resin 73 that encapsulates the semiconductor chip 71 and the bump 72 is formed by, for example, a transfer molding method using an encapsulation mold. For example, a thermosetting insulating resin (e.g., epoxy type resin) including a filler (so-called molding resin) may be used as the encapsulating resin 73.

Figure 5B:
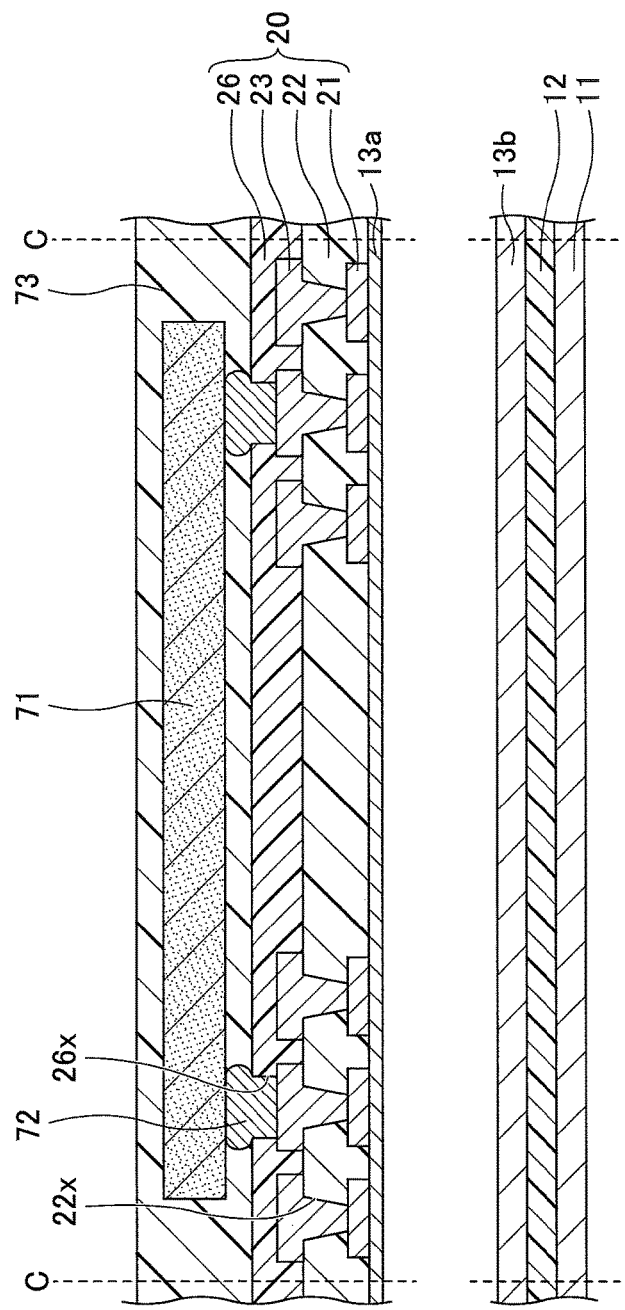

Then, in the process illustrated in FIG. 5B, a part of the support member $10_1$ is peeled. More specifically, an interface between the thin foil 13a of the carrier-attached copper foil 13 and the thick foil 13b of the carrier-attached copper foil 13 is peeled by exerting mechanical force to the support member $10_1$. As described above, the carrier-attached copper foil 13 has a structure in which the thick foil 13b is adhered to the thin foil 13a interposed by a peeling layer (not illustrated). Therefore, the thick foil 13b can be easily peeled from the thin foil 13a together with the peeling layer (not illustrated). Accordingly, only the thin foil 13a remains on the side of the lower surface of the wiring member 20 whereas the other members included in the support member $10_1$ (members of the support member $10_1$ other than the thin foil 13a) are removed. Other than a case where the thick foil 13b is peeled from the thin foil 13a together with the peeling layer, the thick foil 13b may peel from the thin foil 13a when cohesion failure occurs in the peeling layer. Further, the thick foil 13b may peel from the thin foil 13a by the thick foil 13b peeling from the peeling layer.

Figure 5C:
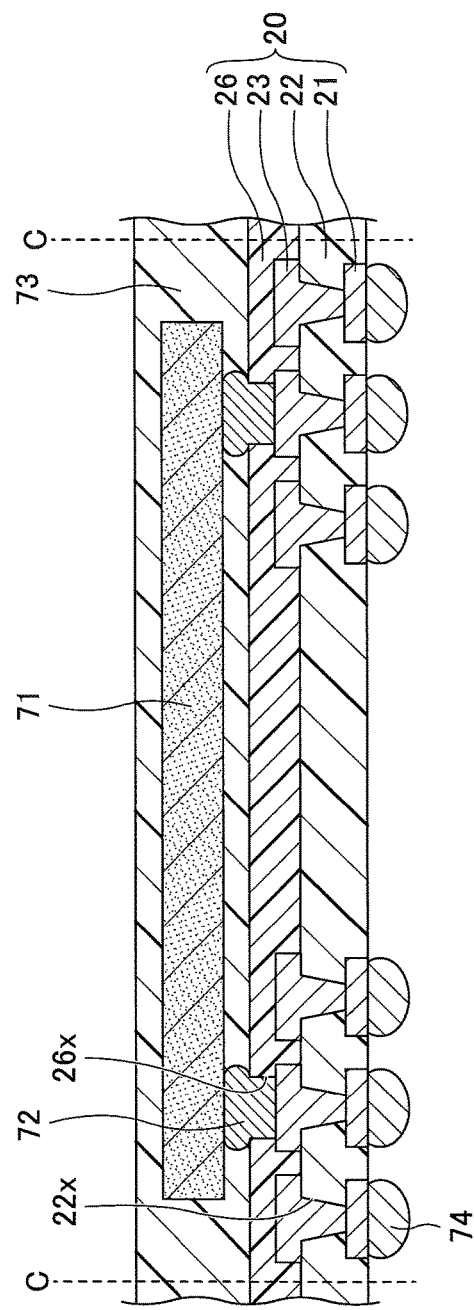

Then, in the process illustrated in FIG. 5C, the thin foil 13a is removed to expose the lower surface of the wiring layer 21, so that a bump 74 can be formed on the lower surface of the wiring layer 21. The thin foil 13a formed of copper may be removed by a wet-etching method using, for example, a hydrogen peroxide/sulfuric acid solution, a sodium persulfate solution, or an ammonium persulfate solution. In a case where the wiring layer 21 is formed of copper, the time for performing the etching process is to be controlled, so that the lower surface of the wiring layer 21 is prevented from being removed after the removal of the thin foil 13a.

Figure 6A:
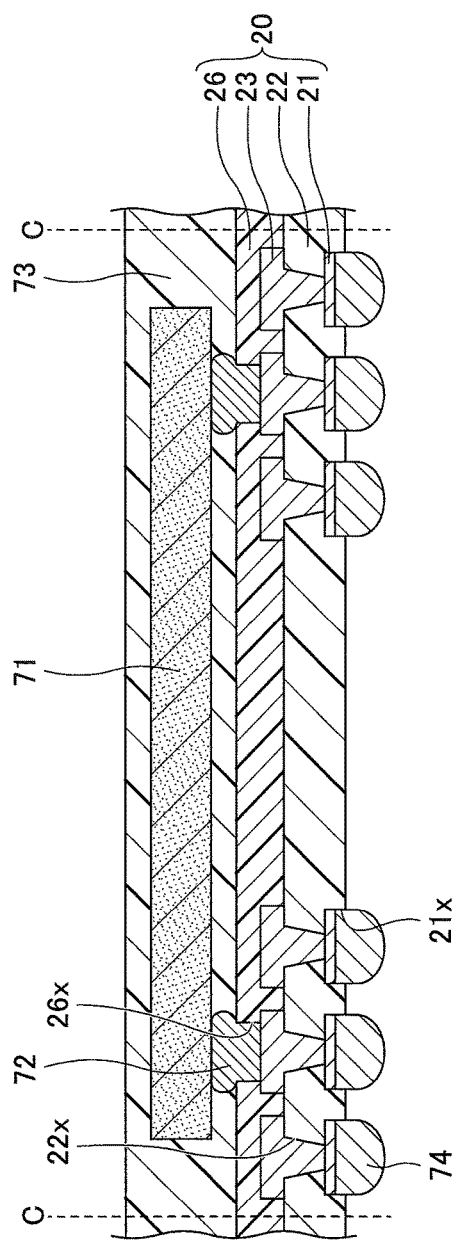

According to necessity, in the process illustrated in FIG. 6A, the etching time may be controlled to a longer time to intentionally remove the lower surface of the wiring layer 21 and form the recess 21x. In this case, the bump 74 can be easily formed because the lower surface of the wiring layer 21 is exposed at an area that is recessed relative to the lower surface of the insulating layer 22. Further, a layer (e.g., gold (Au) layer) that cannot be removed by the etching liquid used for removing the thin foil 13a may be formed beforehand on the lower surface (surface exposed outward) of the wiring layer 21. In this case, the etching time need not be controlled because the gold (Au) layer or the like acts as an etch stop layer.

For example, a solder ball may be used as the bump 74. An alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu) may be used as the material of the solder ball.

Figure 6B:
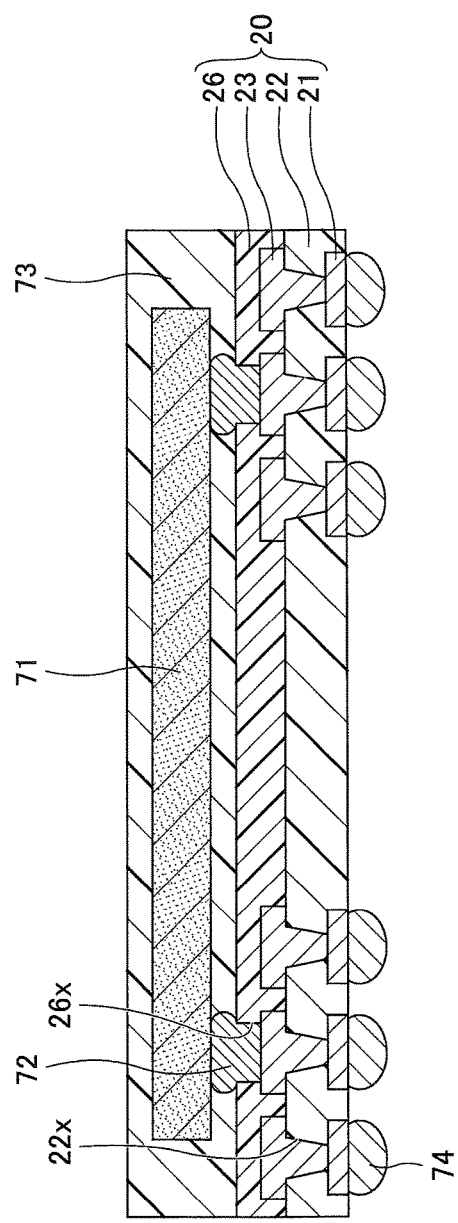
Figure 6C:
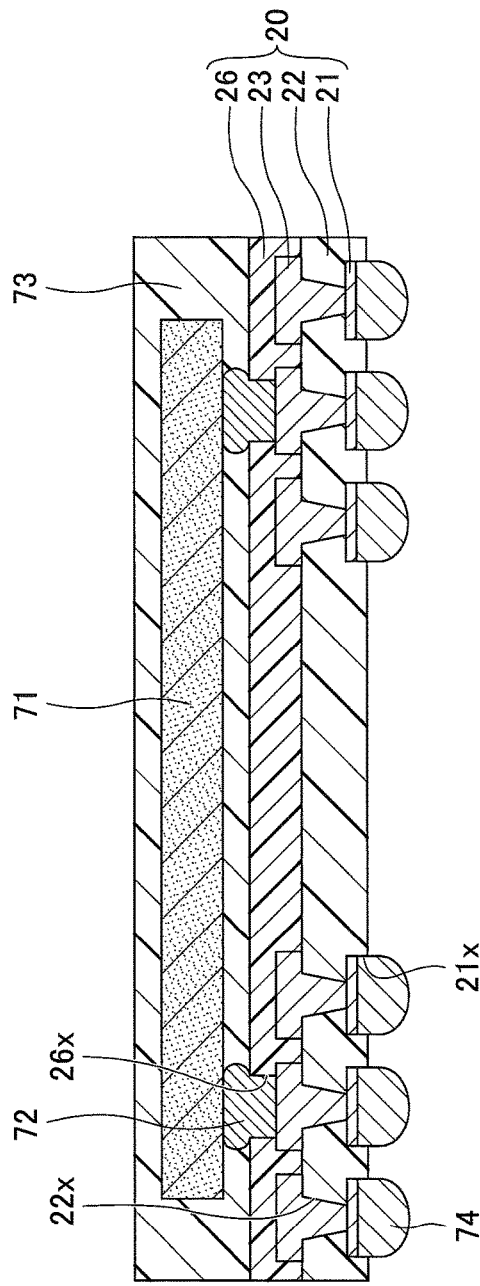

Then, in the process illustrated in FIG. 6B, the structure body illustrated in FIG. 5C is cut along the broken line C by using a slicer or the like. Thereby, multiple semiconductor packages are obtained, in which each semiconductor package has the semiconductor chip 71 mounted on the wiring member 20 and encapsulated by the encapsulating resin 73. In a case where the recess 21x is formed in the lower surface of the insulating layer 22 as illustrated in FIG. 6A, multiple semiconductor packages illustrated in FIG. 6C are obtained.

Hence, in the above-described processes for manufacturing the wiring substrate 1, first, the support body 10 having the support member $10_1$ layered on the support member $10_2$ is fabricated, and then the layers constituting the wiring member 20 are sequentially layered on each of the one and the other surfaces of the support body 10. Accordingly, the support body 10 can provide additional rigidity to the wiring member 20 and facilitate the handing of the wiring substrate 1. Further, the support body 10 can prevent warping of the wiring member 20. In addition, because the rigidity of the wiring member 20 is improved by the support body 10, the wiring member 20 can be prevented from bending or extracting/contracting during the processes of manufacturing the wiring substrate 1. Thereby, the precision of aligning the layers of the wiring member 20 and the layers of the support body 10 can be improved.

Even after the support body 10 is divided into the support member $10_1$ and the support member $10_2$, the wiring members 20 are layered on the support members $10_1$ $10_2$, respectively. Because the number of layers of metal foils (copper foils) included in the support member $10_1$ or the support member $10_2$ and the number of wiring layers including in the wiring member 20 are the same, the wiring substrate 1 can be balanced. Accordingly, even after the sheet division process, the support member $10_1$ or the support member $10_2$ can provide additional rigidity to the wiring member 20, facilitate the handing of the wiring substrate 1, and prevent warping of the wiring member 20.

Further, in the above-described processes for manufacturing the semiconductor package, the support member $10_1$ or the support member $10_2$ is removed after mounting the semiconductor chip 71 on the wiring member 20 of the wiring substrate 1 and encapsulating the semiconductor chip 71 with the encapsulating resin 73. Therefore, even after the support member $10_1$ or the support member $10_2$ is removed, the rigidity of the semiconductor package can be maintained owing to the rigidity of the encapsulating resin 73.

Second Embodiment

The second embodiment of the present invention illustrates a wiring substrate attached with a support body having three wiring layers formed thereon. In the second embodiment, like parts/components are denoted with like reference numerals of the first embodiment and are not further explained.

<Structure of Wiring Substrate of Second Embodiment>

Figure 7:
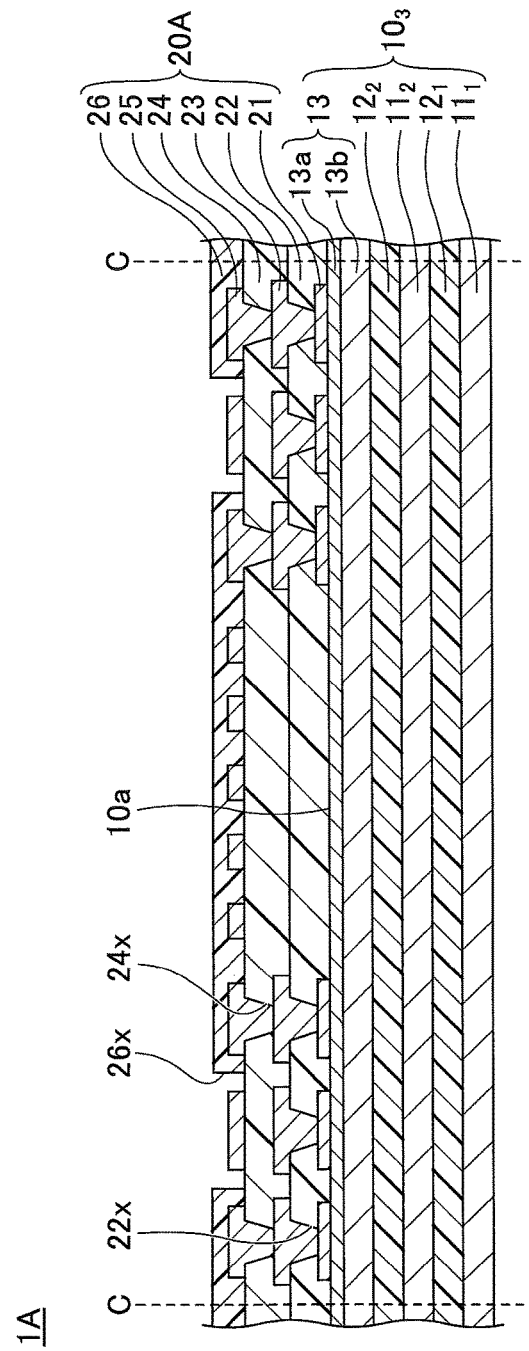
FIG. 7 is a cross-sectional view illustrating a wiring substrate according to a second embodiment of the present invention.

First, a structure of a wiring substrate 1A of the second embodiment is described. FIG. 7 is a cross-sectional view illustrating the wiring substrate 1A of the second embodiment. FIG. 7 corresponds to the cross-sectional view of FIG. 1A. The plan view of the wiring substrate 1A may be similar to the plan view of FIG. 1B. The wiring substrate 1A of FIG. 7 is different from the wiring substrate 1 of FIG. 1A in that the support member $10_1$ is replaced with a support member $10_3$ and that the wiring member 20 is replaced with a wiring member 20A.

The support member $10_3$ is formed having a metal foil and a resin layer alternately layered, so that one metal foil is provided as an outermost layer on the one side of the wiring substrate 14 and another metal foil is provided as an outermost layer on the other side of the wiring substrate 14. More specifically, the support member $10_3$ has a structure in which a copper foil $11_1$, a resin layer $12_1$, a copper foil $11_2$, and a carrier-attached copper foil 13 are sequentially layered. The support member $10_3$ supports the wiring member 20A and functions to improve the strength of the entire wiring substrate 1A and reduce warping of the wiring substrate 1A.

The copper foil $11_1$ and the copper foil $11_2$ may have the same or different layer thickness. Further, the resin layer $12_1$ and the resin layer $12_2$ may have the same or different layer thickness. The support member $10_3$ can be formed to have a desired strength by adjusting the layer thicknesses of the copper foils $11_1$, $11_2$ and adjusting the layer thicknesses of the resin layers $12_1$, $12_2$. Although the number of layers of the metal foils included in the support member $10_1$ of FIG. 1A is two (copper foil 11 and carrier-attached copper foil 13), the number of metal foils included in the support member $10_3$ is three (copper foil $11_1$, copper foil $11_2$, and the carrier-attached copper foil 13).

In the wiring member 20A, an insulating layer 24 and a wiring layer 25 are layered between the insulating layer 22 and the solder resist layer 26. More specifically, the insulating layer 24 is formed on the upper surface of the insulating layer 22 to cover the wiring layer 23. The material and the thickness of the insulating layer 24 may be, for example, the same as those of the insulating layer 22. The insulating layer 24 may include a filler such as silica ($SiO_2$).

The wiring layer 25 that is formed on the one side of the insulating layer 24 is electrically connected to the wiring layer 23. The wiring layer 25 includes a via wiring that fills the inside of a via hole $24x$ that penetrates the insulating layer 24 and exposes the upper surface of the wiring layer 23. The wiring layer 25 also includes a wiring pattern formed on the upper surface of the insulating layer 24. The via hole $24x$ is an inverted circular truncated cone-shaped recess including an opening on a side of the solder resist layer 26 and a bottom surface formed by an upper surface of the wiring layer 23. The area of the opening on the side of the solder resist layer 26 is larger than the area of the bottom surface of the recess. The diameter of the opening of the via hole $24x$ may be, for example, approximately 50 μm to 100 μm. The material of the wiring layer 25 and the thickness of the wiring pattern of the wiring layer 25 may be the same as those of the wiring layer 21.

The solder resist layer 26 includes an opening $26x$. Apart of the wiring layer 25 is exposed at a bottom part of the opening $26x$. The wiring layer 25 that is exposed at the bottom part of the opening $26x$ functions as an electronic device mounting pad to be electrically connected to an electronic device such as a semiconductor chip. In this embodiment, the opening $26x$ is provided to allow a space to be formed between a side surface of the wiring layer 25 that is to be used as the pad and a side surface of the solder resist layer 26. Alternatively, the opening $26x$ may be formed, so that the side surface of the wiring layer 25 to be used as the pad and the side surface of the solder resist layer 26 contact each other. Similar to the first embodiment, the opening $26x$ may be formed, so that the solder resist layer 26 covers an outer edge of the wiring layer 25 to be used as the pad.

<Method for Manufacturing Wiring Substrate and the Like>

Figure 8:
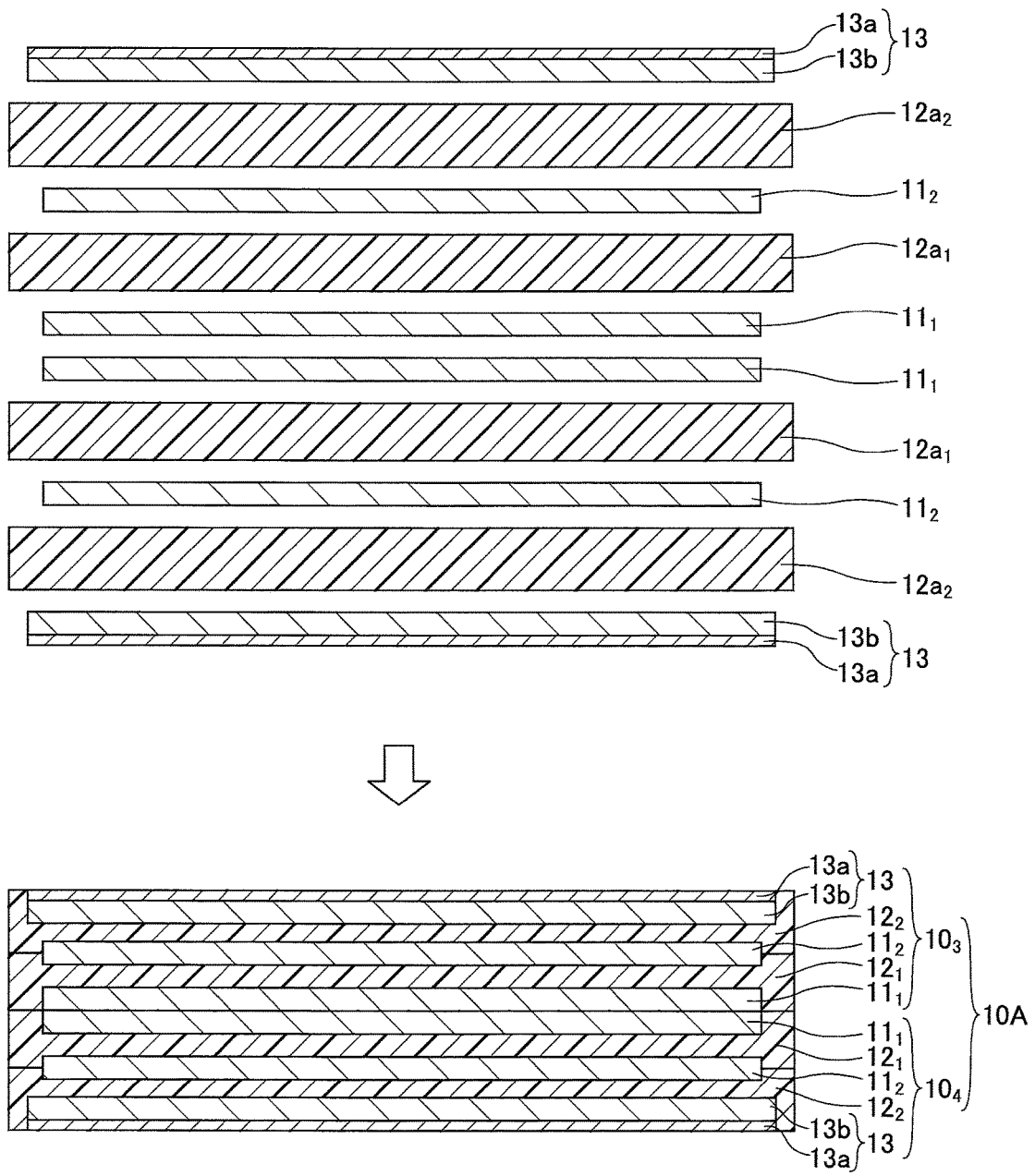
FIGS. 8-9B are schematic diagrams illustrating processes for manufacturing a wiring substrate according to a second embodiment of the present invention.
Figure 10A:
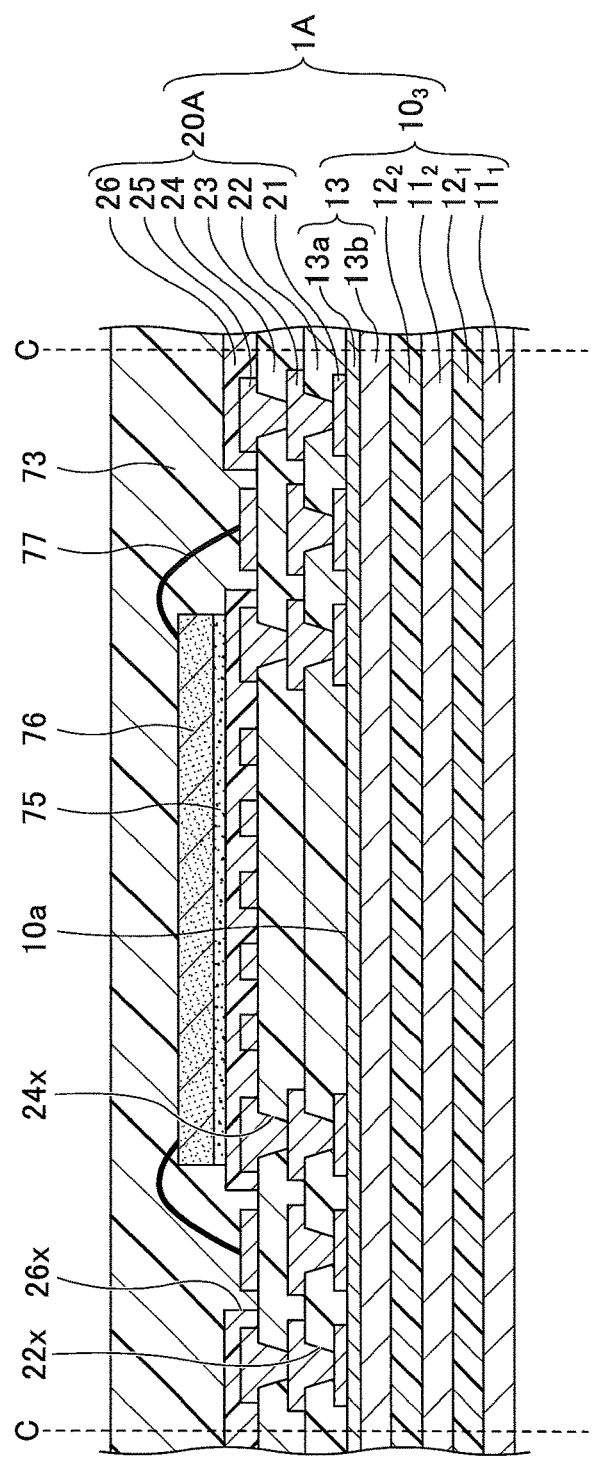
Figure 11:
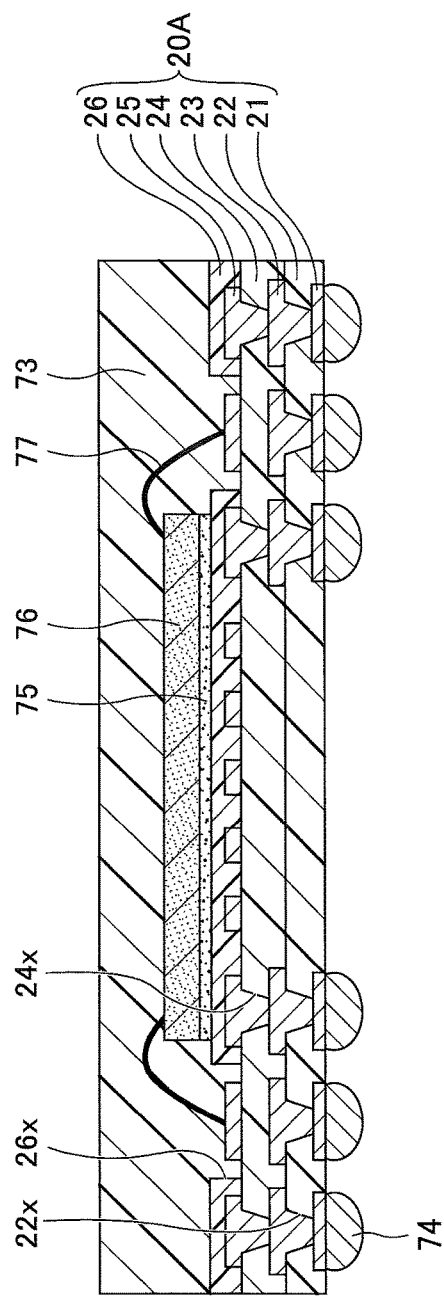

Next, a method for manufacturing a wiring substrate 1A according to the second embodiment of the present invention is described. Further, a method for manufacturing a semiconductor package including the wiring substrate 1A having a semiconductor chip mounted thereon is described. FIGS. 8-9B are schematic diagrams illustrating processes for manufacturing the wiring substrate 1A of the second embodiment. FIGS. 10A-11 are schematic diagrams illustrating processes for manufacturing the semiconductor package of the second embodiment.

In the processes illustrated in FIG. 8, a support body 10A is fabricated. FIG. 8 is a cross-sectional view of the support body 10A of the second embodiment. FIG. 8 corresponds to the cross-sectional view of FIG. 2A. The plan view of the support body 10A may be similar to the plan view of FIG. 2B. In this embodiment, a prepreg is used as the resin layer 12. However, depending on the strength that is desired for the support body 10, the resin layer 12 may be formed of a resin that does not include a glass cloth or the like. It is to be noted that the support member $10_3$ may be referred as the first layered body of the support body 10A, and the support member $10_4$ may be referred as the second layered body of the support body 10A.

For fabricating the support body 10A, two prepregs $12a_1$, $12a_2$ are prepared. Each of the prepregs $12a_1$, $12a_2$ is a woven fabric (e.g., woven glass fabric, woven aramid fabric) or a non-woven fabric (e.g., non-woven glass fabric, non-woven aramid fabric) that is impregnated in a resin such as an epoxy type resin. Each of the prepregs $12a_1$, $12a_2$ is in a semi-cured (B-stage) state. The plan-view shapes of the prepregs $12a_1$, $12a_2$ may be rectangular shapes having a dimension of approximately 400 mm to 500 mm in both length and width. The thickness of each of the prepregs $12a_1$, $12a_2$ may be, for example, approximately 10 μm to 50 μm. However, as described above, the prepregs $12a_1$, $12a_2$ may have different layer thicknesses.

Further, two copper foils $11_1$, $11_2$ and two carrier-attached copper foils 13 including the thin foil $13a$ and the thick foil $13b$ are prepared. The plan-view shape of the carrier-attached copper foil 13 may have a rectangular shape that is slightly smaller than the plan-view shape of the prepregs $12a_1$, $12a_2$. Further, the plan-view shape of the copper foils $11_1$, $11_2$ may be slightly smaller than the plan-view shape of the carrier-attached copper foil 13. The thickness of each of the copper foils $11_1$, $11_2$ may be, for example, approximately 7 μm to 50 μm. However, as described above, the copper foils $11_1$, $11_2$ may have different layer thicknesses. The dimensions such as the thicknesses of the carrier-attached copper foil 13 may be the same as those described above.

Then, as illustrated in the area above the arrow of FIG. 8, the carrier-attached copper foil 13 that is to be the lowermost layer of the support member $10_4$ is positioned in a state having the thin foil $13a$ faced downward. Then, in this state, the prepreg $12a_2$, the copper foil $11_2$, the prepreg $12a_1$, and the copper foil $11_1$ that form the support member $10_4$ are sequentially layered on the thick foil $13b$ of the carrier-attached copper foil 13. Then, the copper foil $11_1$, the prepreg $12a_1$, the copper foil $11_2$, and the prepreg $12a_2$ that form the support member $10_3$ are sequentially layered on the copper foil $11_1$ of the support member $10_4$. Then, the carrier-attached copper foil 13 that is to form the support member $10_3$ is layered on the prepreg $12a_2$ of the support member $10_3$ in a state having the thin foil $13a$ faced upward. It is to be noted that the aforementioned members are sequentially layered to have their centers substantially matched to each other.

Then, each of the prepregs $12a_1$, $12a_2$ is cured by exerting pressure from the carrier-attached copper foil 13 of the support member $10_3$ to the side of the carrier-attached copper foil 13 of the support member $10_4$ in a state where each of the prepregs $12a_1$, $12a_2$ is heated at a temperature of approximately 190° C. to 230° C. in a vacuum atmosphere. Thereby, as illustrated in the area below the arrow of FIG. 8, the prepregs $12a_1$, $12a_2$ are cured to become resin layers $12_1$, $12_2$. Accordingly, the support body 10A having the support member $10_4$ and the support member $10_3$ layered on the support member $10_4$ is fabricated.

In the support member $10_3$, the carrier-attached copper foil 13 is adhered to the resin layer $12_2$ by being embedded in the upper surface of the resin layer $12_2$ whereas the copper foil $11_2$ is adhered to the resin layers $12_1$, $12_2$ by being embedded in the lower surface of the resin layer $12_2$ and the upper surface of the resin layer $12_1$. The upper surface of the carrier-attached copper foil 13 (upper surface of the thin foil $13a$) is exposed from the upper surface of the resin layer $12_2$, and the side surface of the carrier-attached copper foil 13 is covered by the resin layer $12_2$. The upper surface of the thin foil $13a$ of the carrier-attached copper foil 13 may be flush with the upper surface of the resin layer $12_2$. Further, the copper foil $11_1$ is adhered to the resin layer $12_1$ by being embedded in the lower surface of the resin layer $12_1$. The lower surface of the copper foil $11_1$ is exposed from the lower surface of the resin layer $12_1$, and the side surface of the copper foil $11_1$ is covered by the resin layer $12_1$. The lower surface of the copper foil $11_1$ may be flush with the lower surface of the resin layer $12_1$.

For the sake of convenience, the support member $10_4$ is indicated with a reference numeral different from the reference numeral of the support member $10_3$. However, the support member $10_4$ has the same layer configuration as the support member $10_3$ and is different from the support member $10_3$ in that the support member $10_4$ is vertically inverted relative to the support member $10_3$. Although the lower surface (exposed surface) of the copper foil $11_1$ of the support member $10_3$ and the upper surface (exposed surface) of the copper foil $11_1$ of the support member $10_4$ contact each other, the lower surface of the copper foil $11_1$ of the support member $10_3$ and the upper surface of the copper foil $11_1$ of the support member $10_4$ are not adhered to each other. An outer peripheral part of an exposed surface of the resin layer $12_1$ of the support member $10_3$ surrounding the lower surface of the copper foil $11_1$ of the support member $10_3$ (area having no copper foil $11_1$ formed thereon) and an outer peripheral part of an exposed surface of the resin layer $12_1$ of the support member $10_4$ surrounding the upper surface of the copper foil $11_1$ of the support member $10_4$ (area having no copper foil $11_1$ formed thereon) are adhered to each other.

Figure 9A:
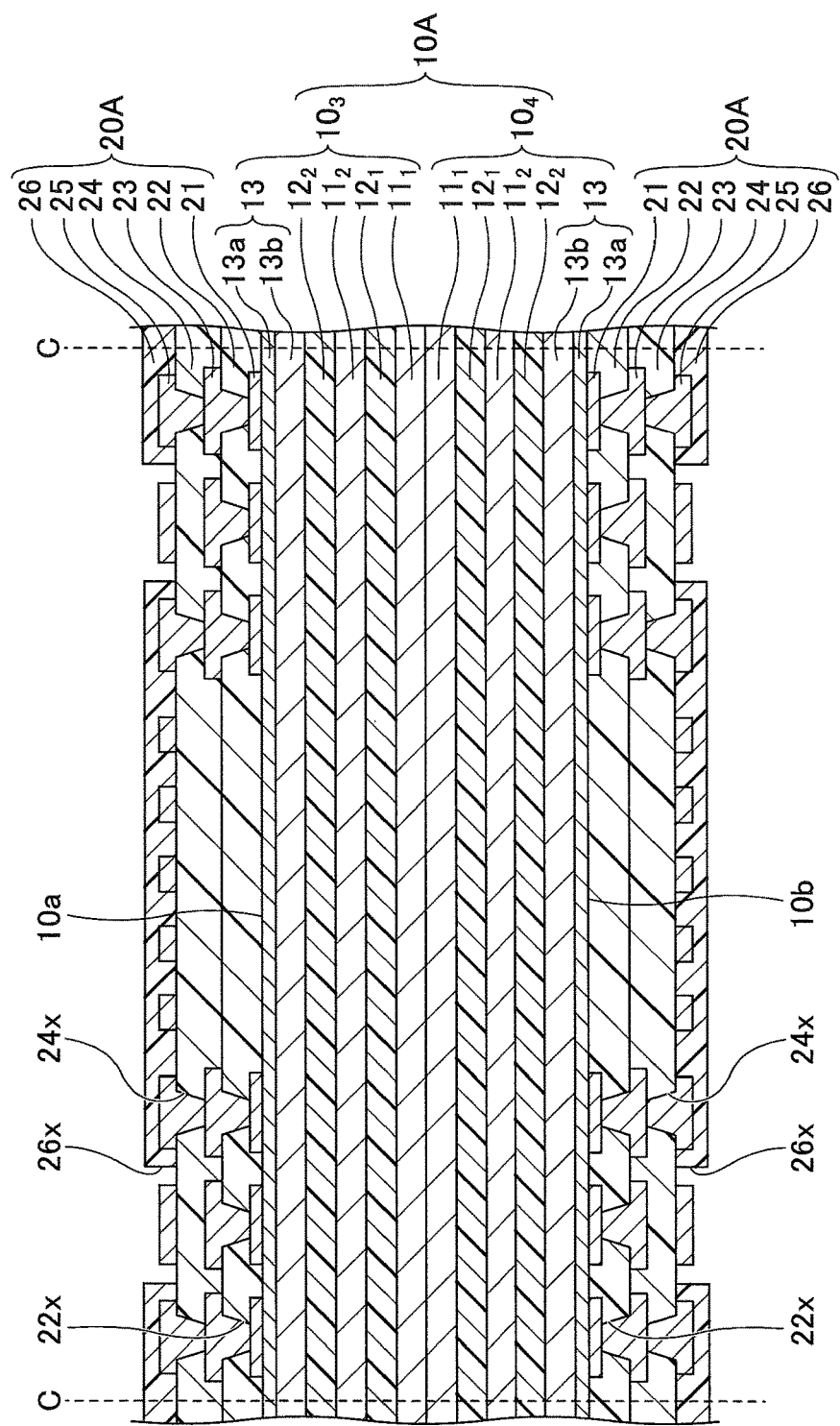
Figure 9B:
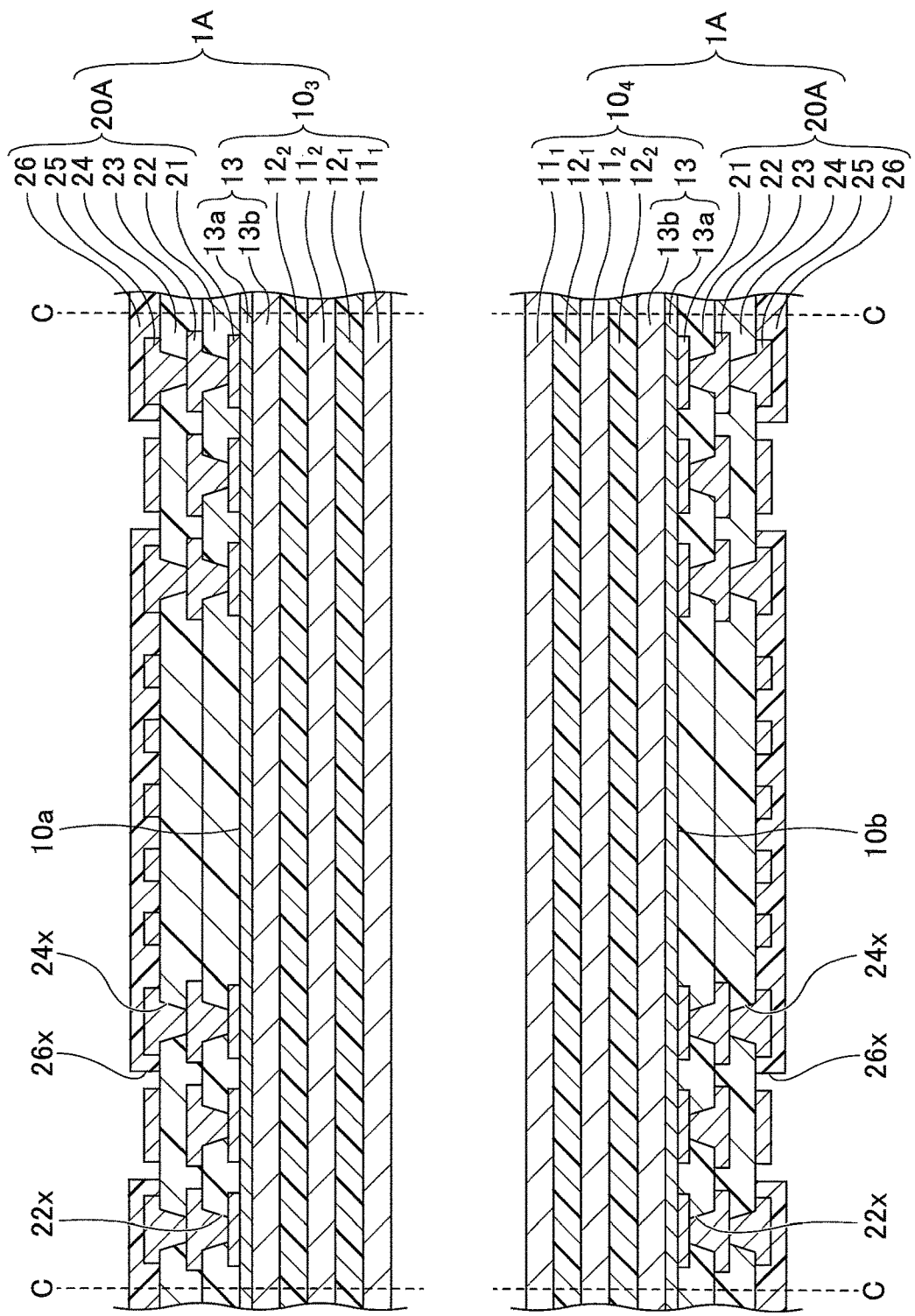

Then, by performing the processes similar to the processes of FIGS. 3A to 4B in the process illustrated in FIG. 9A, wiring layers and insulating layers are alternately layered on the one surface $10a$ of the support body 10A (i.e., on the support member $10_3$) to fabricate the wiring member 20A. Further, wiring layers and insulating layers are alternately layered on the other surface $10b$ of the support body 10A (i.e., on the support member $10_4$) to fabricate the wiring member 20A. The insulating layer 24, the via hole 24x, and the wiring layer 25 may be fabricated by performing the similar processes for fabricating the insulating layer 22, the via hole 22x, and the wiring layer 23.

Then, similar to the process illustrated in FIG. 4C of the first embodiment, multiple wiring substrates 1A are fabricated by performing sheet division in the process illustrated in FIG. 9B. Accordingly, each sheet is separated from the adhering part between the support member $10_3$ and the support member $10_4$ by the sheet division process. Thereby, each divided sheet becomes a state in which the lower surface of the copper foil $11_1$ of the support member $10_3$ and the upper surface of the copper foil $11_1$ of the support member $10_4$ are only contacting each other. As a result, the support member $10_3$ and the support member $10_4$ can be easily divided at the part where the copper foil $11_1$ contact each other as illustrated in FIG. 9B. Thus, multiple wiring substrates (in this embodiment, twenty wiring substrates) 1A are fabricated.

As described above, for the sake of convenience, the support member $10_3$ and the support member $10_4$ are indicated with different reference numerals. However, the support member $10_3$ and the support member $10_4$ have the same layer configuration. Therefore, the wiring substrate 1A having the wiring member 20A layered on the support member $10_3$ and the wiring substrate 1A having the wiring member 20A layered on the support member $10_4$ are the same.

Then, in the process illustrated in FIG. 10A, the semiconductor chip 76 that is in a face-up state is mounted on the wiring substrate 1A by way of an adhesive layer 75 (e.g., die attach film). Then, a bonding machine is used to bond the wiring layer 25 exposed from the opening 26x of the wiring substrate 1A to a pad (not illustrated) of the semiconductor chip 76 by way of a bonding wire 77. For example, a copper wire or a gold wire may be used as the bonding wire 77. Then, the encapsulating resin 73 that encapsulates the semiconductor chip 76 and the bonding wire 77 is formed by, for example, a transfer molding method using an encapsulation mold.

Then, similar to the process illustrated in FIG. 5B, a part of the support member $10_3$ is peeled in the process illustrated in FIG. 10B. Accordingly, only the thin foil $13a$ remains on the side of the lower surface of the wiring member 20A whereas the other members included in the support member $10_3$ (members of the support member $10_3$ other than the thin foil $13a$) are removed.

Then, similar to the process illustrated in FIG. 5C, the thin foil $13a$ is removed to expose the lower surface of the wiring layer 21 in the process illustrated in FIG. 10C. Thereby, the bump 74 can be formed on the lower surface of the wiring layer 21.

Then, in the process illustrated in FIG. 11, the structure body illustrated in FIG. 10C is cut along the broken line C by using a slicer or the like. Thereby, multiple semiconductor packages are obtained, in which each semiconductor package has the semiconductor chip 76 mounted on the wiring member 20A and encapsulated by the encapsulating resin 73.

Similar to the wiring substrate 1 of the first embodiment, the wiring substrate 1A is also formed, so that the number of layers of metal foils (copper foils) included in the support member $10_3$ or the support member $10_4$ and the number of wiring layers included in the wiring member 20A are the same (both having three layers). Accordingly, the wiring substrate 1A can attain the same effects as those of the wiring substrate 1. Further, the preferred relation between the thickness of the entire wiring member 20A and the thickness of the entire support member $10_3$ or the entire support member $10_4$ is similar to that of the first embodiment. Further, the preferred composition between the resin layer and the insulating layer is similar to that of the first embodiment.

Modified Example of Second Embodiment

The modified example of the second embodiment illustrates a wiring substrate attached with a support body having three wiring layers formed thereon. Further, the modified example of the second embodiment illustrates a semiconductor package (electronic device-mounted substrate) having a structure different from the structure of the semiconductor package of the second embodiment. In the modified example of the second embodiment, like parts/components are denoted with like reference numerals of the first and second embodiments and are not further explained.

Figure 12:
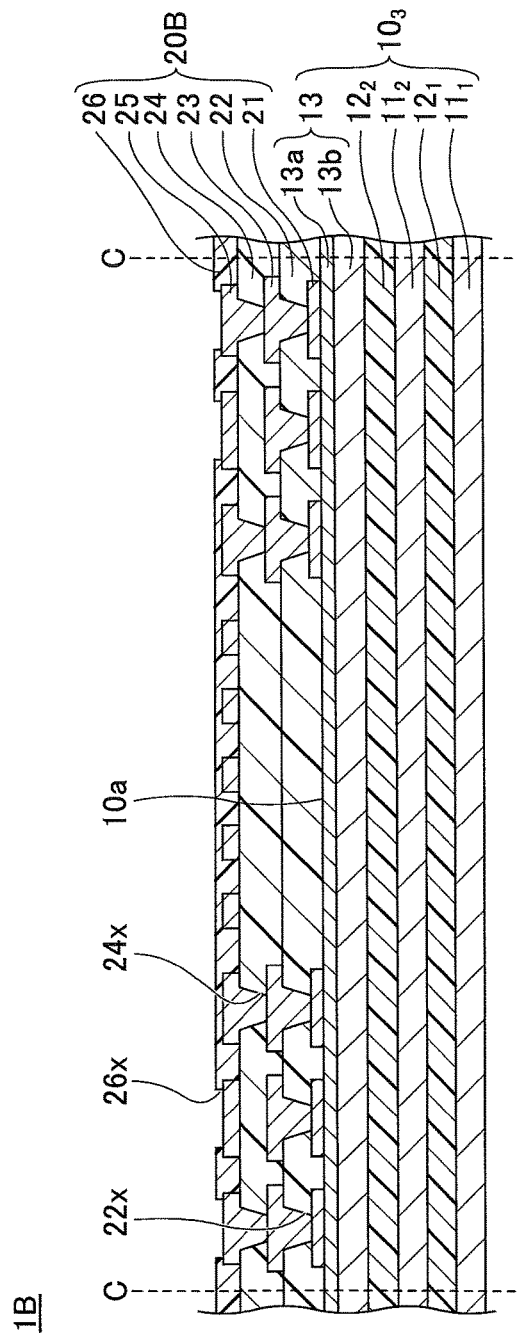
FIG. 12 is a cross-sectional view illustrating a wiring substrate according to the second embodiment of the present invention.

FIG. 12 is a cross-sectional view illustrating a wiring substrate 1B according to the modified example of the second embodiment. FIG. 12 corresponds to the cross-sectional view of FIG. 1A. The plan view of the wiring substrate 1B may be similar to the plan view of FIG. 1B.

The wiring substrate 1B of FIG. 12 is different from the wiring substrate 1A (see FIG. 7) in that the position and number of the openings 26x of the solder resist layer 26 are different from those of the solder resist layer 26 of the wiring substrate 1A. In this modified example, the opening 26x are formed, so that the solder resist layer 26 covers an outer edge of the wiring layer 25 to be used as a pad. The openings 26x may be arranged in, for example, two rows to surround the periphery of the outer edge of the wiring layer 25.

FIGS. 13A-15 illustrate the processes for manufacturing the semiconductor package (electronic device-mounted substrate) according to the modified example of the second embodiment. In the process illustrated in FIG. 13A, solder balls 95 are mounted on the wiring layer 25 exposed from the openings 26x of the wiring substrate 1B. The wiring substrate 1B is manufactured by performing the same processes for manufacturing the wiring substrate 1A of the second embodiment. The solder ball 95 may have a structure in which the surrounding of a copper core ball 95a is covered by solder 95b. In this case, the solder ball 95 and the wiring layer 25 are bonded by melting the solder 95b and then solidifying the solder 95b.

Then, in the process illustrated in FIG. 13B, a wiring substrate 80 that is to be bonded to the wiring substrate 1B in a subsequent process is fabricated by using a widely known method. The wiring substrate 80 includes a wiring layer 82, an insulating layer 83, a wiring layer 84, and a solder resist layer 85 that are layered on an upper surface of a core layer 81. Further, openings 85x, 85y that selectively expose the wiring layer 84 are formed in the solder resist layer 85. The wiring layer 84 exposed in the opening 85x is a pad to be connected to a semiconductor chip 78. The wiring layer 84 exposed in the opening 85y is a pad to be connected to the wiring substrate 1B.

The wiring substrate 80 further includes a wiring layer 86, an insulating layer 87, a wiring layer 88, and a solder resist layer 89 that are layered on a lower surface of the core layer 81. Further, an opening 89x that selectively exposes the wiring layer 88 is formed in the solder resist layer 89. The wiring layer 88 exposed in the opening 89x is a pad to be connected to an external connection terminal. The wiring layer 82 and the wiring layer 86 are electrically connected by a through-wiring 90 that penetrates the core layer 81.

Then, the semiconductor chip 78 that is in a face-down state is flip-chip bonded to the wiring substrate 80. More specifically, the wiring layer 84 exposed from the opening 85x of the wiring substrate 80 and a pad (not illustrated) of the semiconductor chip 78 are bonded by way of the bump 72 by performing a reflow process or the like. Then, an underfill resin 79 is supplied between the semiconductor chip 78 and the wiring substrate 80. An electronic device other than the semiconductor chip 78 (e.g., capacitor, inductor) may be mounted on the wiring substrate 80.

Figure 13C:
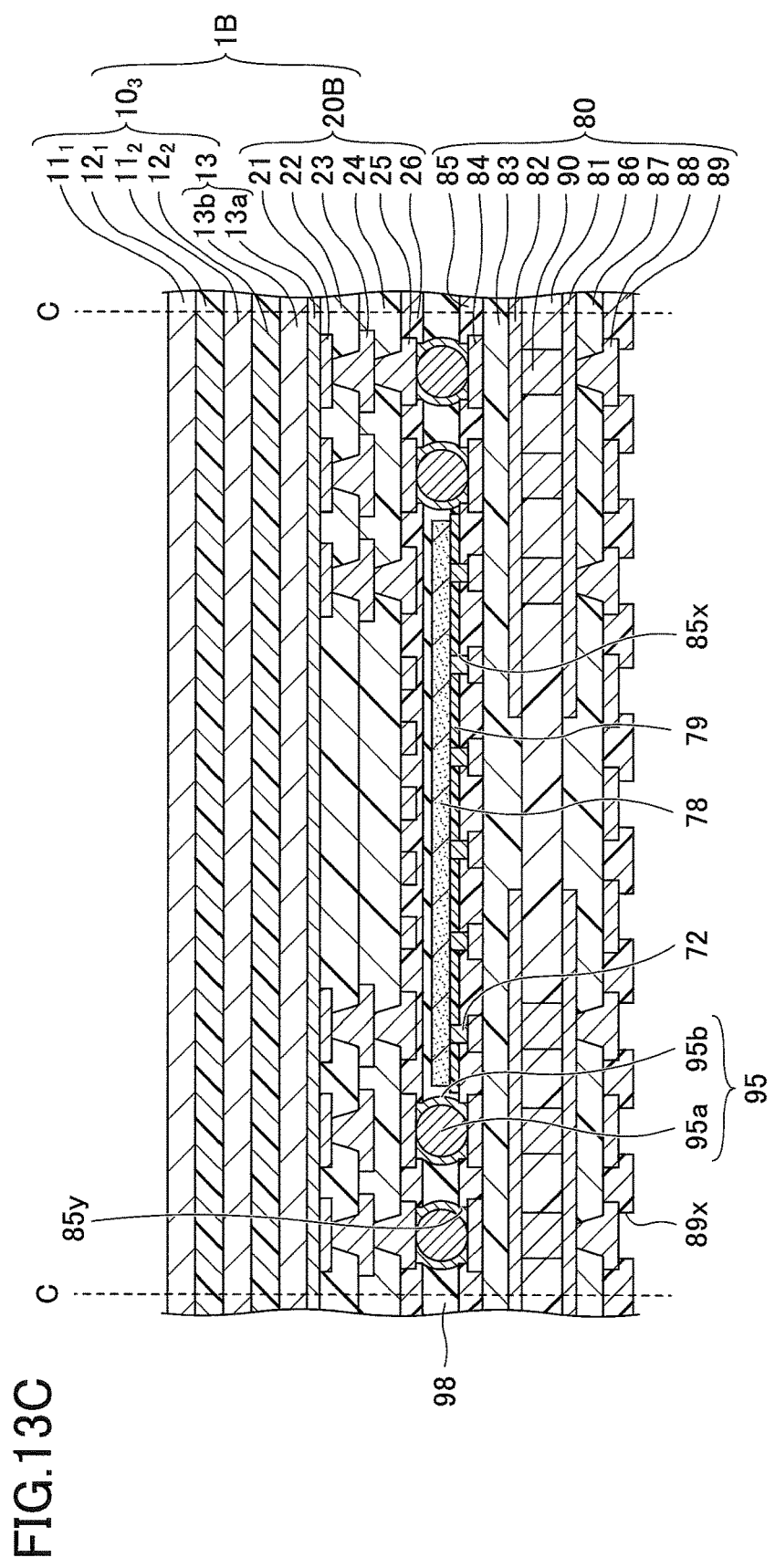
FIGS. 13A-15 are schematic diagrams illustrating processes for manufacturing a semiconductor package according to a modified example of the second embodiment.

Then, in the process illustrated in FIG. 13C, the wiring substrate 1B and the wiring substrate 80 are bonded by way of an encapsulating resin 98 formed therebetween. More specifically, the wiring substrate 1B is positioned on the wiring substrate 80, so that the solder 95b of the solder ball 95 contacts the upper surface of the wiring layer 84 exposed from the opening 85y. In positioning the wiring substrate 1B, the diameter of the copper core ball 95a of the solder ball 95 is determined to prevent the semiconductor chip 78 and the solder resist layer 26 of the wiring substrate 1B from contacting each other.

Then, a reflow process is performed while exerting pressure from the wiring substrate 1B to the wiring substrate 80 to melt and solidify the solder 95b. Thereby, the wiring layer 25 and the wiring layer 84 are bonded by way of the solder ball 95. In bonding the wiring layer 25 and the wiring layer 84, the solder 95b solidifies in a state where the copper core ball 95a is contacting the lower surface of the wiring layer 25 and the upper surface of the wiring layer 84. Therefore, copper core ball 95a functions as a spacer, so that the space between the wiring substrate 1B and the wiring substrate 80 maintains a predetermined value. Then, the encapsulating resin 98 is formed between the wiring substrate 1B and the wiring substrate 80 by, for example, a transfer molding method using an encapsulation mold. For example, a thermosetting insulating resin (e.g., epoxy type resin) including a filler (so-called molding resin) may be used as the encapsulating resin 98.

Figure 14A:
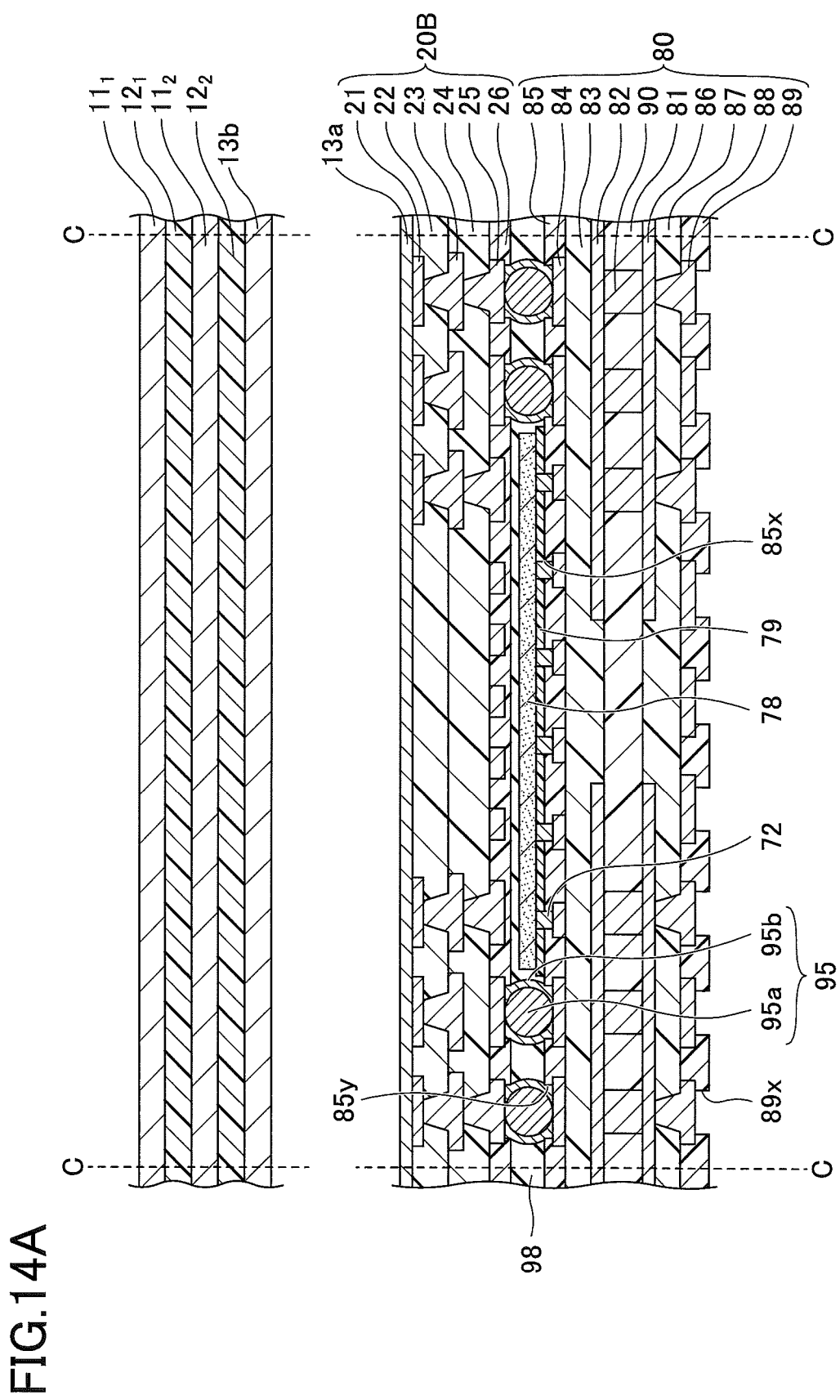

Then, in the process illustrated in FIG. 14A, similar to the process illustrated in FIG. 5B of the first embodiment, a part of the support member $10_3$ is peeled. Accordingly, only the thin foil 13a remains on the side of the upper surface of the wiring member 20B whereas the other members included in the support member $10_3$ (members of the support member $10_3$ other than the thin foil 13a) are removed. Then, similar to the process illustrated in FIG. 5C, the thin foil 13a is removed to expose the upper surface of the wiring layer 21 in the process illustrated in FIG. 14B. Thereby, the bump 74 can be formed on the lower surface of the wiring layer 88 exposed from the opening 89x of the solder resist layer 89 of the wiring substrate 80.

Figure 14B:
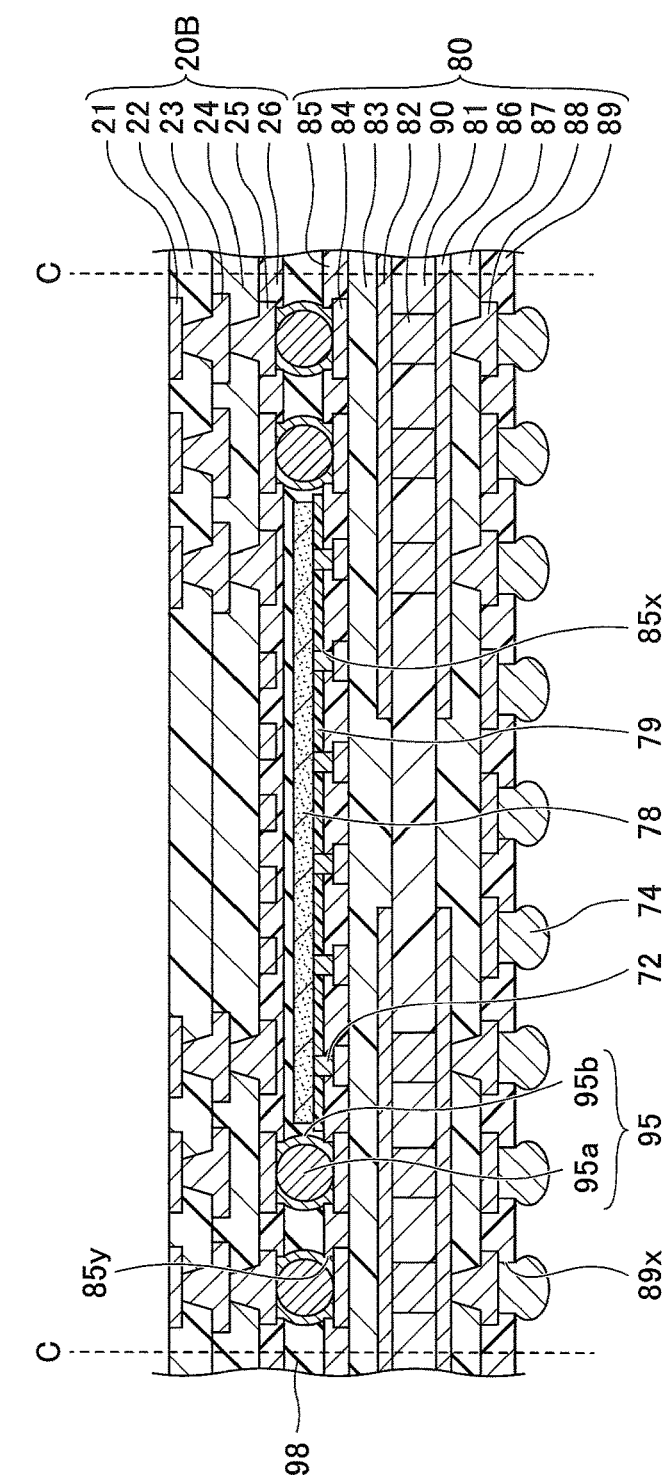
Figure 15:
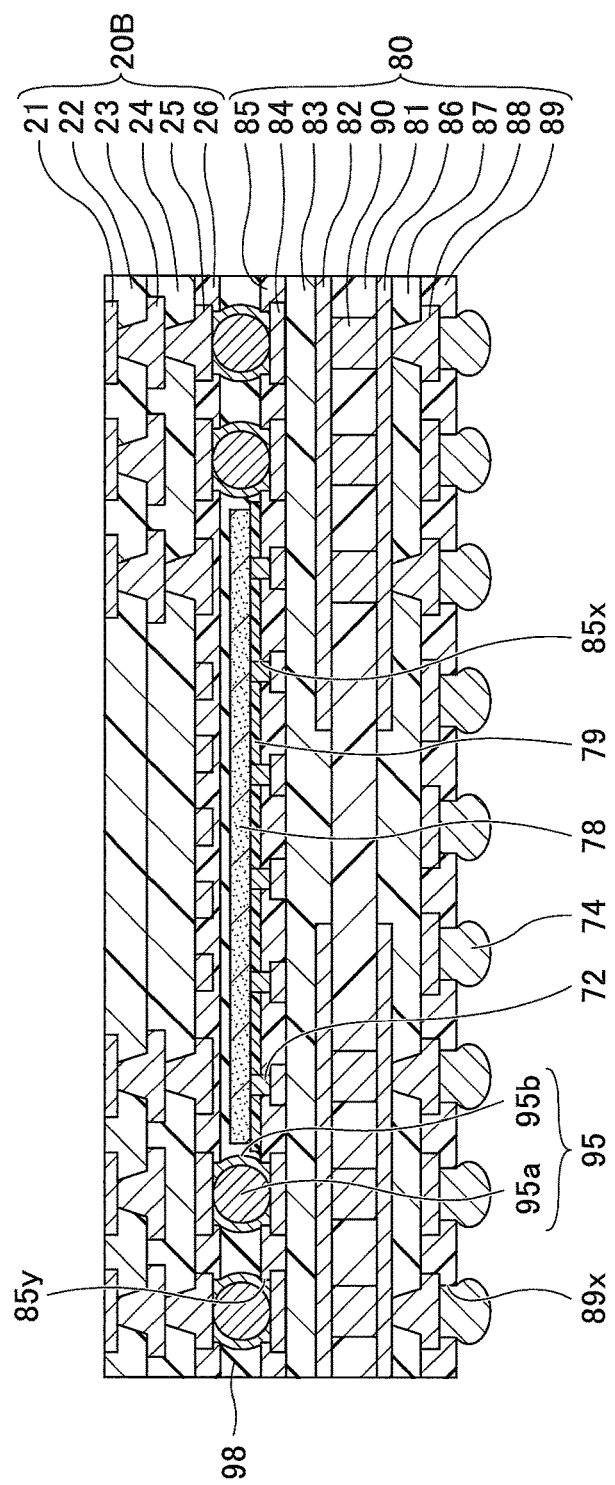

Then, in the process illustrated in FIG. 15, the structure body illustrated in FIG. 14B is cut along the broken line C by using a slicer or the like. Thereby, multiple semiconductor packages (electronic device-installed substrate) are obtained, in which each semiconductor package has the wiring member 20B mounted on the wiring substrate 80 including the semiconductor chip 78.

Similar to the wiring substrates 1 and 1A of the first and second embodiments, the wiring substrate 1B is also formed, so that the number of layers of metal foils (copper foils) included in the support member $10_3$ or the support member $10_4$ and the number of wiring layers included in the wiring member 20B are the same (both having three layers). Accordingly, the wiring substrate 1B can attain the same effects as those of the wiring substrates 1 and 1A. Further, the preferred relation between the thickness of the entire wiring member 20B and the thickness of the entire support member $10_3$ or the entire support member $10_4$ is similar to those of the first and second embodiments. Further, the preferred composition between the resin layer and the insulating layer is similar to those of the first and second embodiments.

Various aspects of the subject-matter described herein are set out non-exhaustively in the following numbered clauses:

1. A method for manufacturing a wiring substrate, the method comprising:

fabricating a support body having a first layered body adhered to a second layered body;

fabricating first and second wiring members including fabricating the first wiring member on the first layered body and fabricating a second wiring member on the second layered body, each of the first and second wiring members including a plurality of metal foils and at least one resin layer that are alternately layered; and fabricating first and second wiring substrates by separating the first layered body and the second layered body from each other, the first wiring substrate having the first wiring member layered on the first layered body, the second wiring substrate having the second wiring member layered on the second layered body;

wherein the fabricating of the support body includes forming the first layered body, so that one of the plurality of metal foils is provided as a first outermost layer on the one side of the first layered body and another one of the plurality of metal foils is provided as a second outermost layer on another side of the first layered body, wherein the first outermost layer includes a thick foil and a thin foil that is peelably adhered to the thick foil, wherein the first outermost layer is embedded in the resin layer to expose one surface of the thin foil, wherein the second outermost layer is embedded in the resin layer, so that a side surface of the second outermost layer is covered and another surface of the second outermost layer is exposed, wherein the fabricating of the support body further includes forming the second layered body, so that the second layered body has a same layer configuration as a layer configuration of the first layered body and is vertically inverted relative to the first layered body, wherein another surface of the second outermost layer of the first layered body contacts an exposed surface of the second outermost layer of the second layered body, wherein an outer peripheral part of the another surface of the second outermost layer of the first layered body and an outer peripheral part of the exposed surface of the second outermost layer of the second layered body are adhered to each other, wherein the fabricating of the first and second wiring members includes forming the first wiring member on the thin foil of the first outermost layer, so that the number of the plurality of metal foils of the first layered body and the number of the wiring layers of the first wiring member are the same, wherein the fabricating of the first and second wiring members includes forming the second wiring member on the thin foil of the second outermost layer, so that the number of the plurality of metal foils of the second layered body and the number of the wiring layers of the second wiring member are the same, wherein the fabricating of the first and second wiring substrates includes cutting the support body, the first wiring member, and the second wiring member in a thickness direction, and wherein the support body, the first wiring member, and the second wiring member are cut an area that is more inward than an area where the outer peripheral part of the another surface of the second outermost layer of the first layered body and the outer peripheral part of the exposed surface of the second outermost layer of the second layered body are adhered to each other.

2. The method of clause 1, wherein in the fabricating of the support body, the first outermost layer of the second layered body is arranged, so that the thin foil is faced downward, a resin layer in a semi-cured state and the second outermost layer are sequentially layered on the thick foil to form the second layered body, the second outermost layer of the first layered body and another resin layer in a semi-cured state are sequentially layered on the second outermost layer of the second layered body, the first outermost layer of the first layered body is arranged, so that the thin foil is faced upward, the resin layers in the semi-cured state are cured by heating the resin layers while exerting pressure from the first outermost layer of the first layered body to aside of the first outermost layer of the second layered body.

3. The method of clause 1, wherein in each of the first and second layered bodies, the resin layer includes a first resin layer and a second resin layer, wherein the fabricating of the support body includes embedding the first outermost layer in the first resin layer to expose the one surface of the thin foil, embedding the second outermost layer in the second resin layer to cover the side surface of the second outermost layer and expose the another surface of the second outermost layer, and providing another metal foil between the first resin layer and the second resin layer.

4. The method of clause 1, wherein the fabricating of the support body includes covering a part of a side surface of the another metal foil and one surface of the another metal foil with the first resin layer, covering a remaining part of the side surface of the another metal foil and another surface of the another metal foil with the second metal foil.

5. A method for manufacturing a semiconductor package, the method comprising: forming the wiring substrate of clause 1;

mounting a semiconductor chip or another wiring substrate including the semiconductor chip on the first wiring member;

forming an encapsulating resin that encapsulates the semiconductor chip;

peeling an interface between the thick foil of the first outermost layer and the thin foil of the first outermost layer after the forming of the encapsulating resin, so that only the thin foil remains on a side of the first wiring member and other members included in the first layered body are removed;

and removing the thin foil by etching.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, although the copper foils and carrier-attached copper foils are used in the above-described embodiments, a metal foil or a carrier-attached metal foil including a copper alloy or a metal such as aluminum, nickel, or zinc may also be used.

What is claimed is:

1. A wiring substrate comprising:
a support member; and
a wiring member formed on one side of the support member;
wherein the support member includes a first metal foil, a resin layer layered on the first metal foil, and a second metal foil layered on the resin layer, each of the first metal foil and the second metal foil being a copper foil,
wherein the second metal foil includes a thick foil and a thin foil that is peelably adhered to the thick foil, the thin foil being thinner than the thick foil,
wherein the thick foil contacts the resin layer,
wherein the wiring member includes a first wiring layer, an insulating layer layered on the first wiring layer, and a second wiring layer layered on the insulating layer, each of the first wiring layer and the second wiring layer being copper, and the insulating layer being resin,
wherein the insulating layer of the wiring member is formed of an insulating resin material having the same composition as the resin layer of the support member, wherein the first wiring layer is in direct contact with an upper surface of the thin foil, and is thicker than the thin foil, wherein the insulating layer is layered on the thin foil and covers an upper surface of the first wiring layer and a side surface of the first wiring layer, wherein the insulating layer includes a via hole penetrating the insulating layer, wherein the first wiring layer and the second wiring layer are connected by way of the via hole, and wherein a total number of metal foil layers from an exposed lower surface of the support member to the upper surface of the thin foil is equal to a total number of wiring layers in the wiring member.

2. The wiring substrate as claimed in claim 1, wherein a plurality of the first metal foils are alternately layered with respect to a plurality of the resin layers, and wherein a plurality of the second wiring layers are alternately layered with respect to a plurality of the insulating layers.

3. The wiring substrate as claimed in claim 1, further comprising:

a solder resist layer provided on the second wiring layer.

4. The wiring substrate as claimed in claim 1, wherein a thickness of the thin foil is 1.5 micrometers to 5 micrometers, and a thickness of the first wiring layer is 5 micrometers to 20 micrometers.

5. The wiring substrate as claimed in claim 1, wherein a thickness of the first metal foil is 7 micrometers to 50 micrometers, a thickness of the thick foil being 10 micrometers to 50 micrometers, a thickness of the thin foil being 1.5 micrometers to 5 micrometers, a thickness of the resin layer being 10 micrometers to 50 micrometers, a thickness of the first wiring layer being 5 micrometers to 20 micrometers, a thickness of the second wiring layer being 5 micrometers to 20 micrometers, and a thickness of the insulating layer being 10 micrometers to 50 micrometers.

6. The wiring substrate as claimed in claim 1, wherein the resin layer is a woven or non-woven cloth impregnated with resin.

7. The wiring substrate as claimed in claim 1, wherein the insulating layer of the wiring member is a woven or non-woven cloth impregnated with resin.

8. A support body comprising:

a first metal foil;

a second metal foil having an upper surface on which the first metal foil is layered;

a first resin layer layered on an upper surface of the first metal foil;

a second resin layer layered on a lower surface of the second metal foil;

a third metal foil layered on an upper surface of the first resin layer; and a fourth metal foil layered on a lower surface of the second resin layer;

wherein the third metal foil includes a thick foil and a thin foil that is peelably adhered to the thick foil, the thin foil being thinner than the thick foil, wherein the thick foil of the third metal foil contacts the first resin layer, wherein the fourth metal foil includes a thick foil and a thin foil that is peelably adhered to the thick foil, the thin foil being thinner than the thick foil, wherein the thick foil of the fourth metal foil contacts the second resin layer, wherein an outer peripheral part of the first resin layer is positioned more outward than an outer peripheral part of the first metal foil and an outer peripheral part of the third metal foil, the outer peripheral part of the third metal foil being positioned more outward than the outer peripheral part of the first metal foil, wherein the first resin layer covers a side surface of the first metal foil and a side surface of the third metal foil, wherein an outer peripheral part of the second resin layer is positioned more outward than an outer peripheral part of the second metal foil and an outer peripheral part of the fourth metal foil, the outer peripheral part of the fourth metal foil being positioned more outward than the outer peripheral part of the second metal foil, wherein the second resin layer covers a side surface of the second metal foil and a side surface of the fourth metal foil, wherein the first resin layer, the second resin layer, the first metal foil, the second metal foil, the third metal foil, and the fourth metal foil each have a rectangular flat plate shape, an outer perimeter of which defines a rectangular plan-view shape thereof, and wherein the rectangular plan-view shape of the first resin layer is larger than, and fully encloses in a plan view, both the rectangular plan-view shape of the first metal foil and the rectangular plan-view shape of the third metal foil, the rectangular plan-view shape of the third metal foil being larger than, and fully enclosing in a plan view, the rectangular plan-view shape of the first metal foil, and the rectangular plan-view shape of the second resin layer is larger than, and fully encloses in a plan view, both the rectangular plan-view shape of the second metal foil and the rectangular plan-view shape of the fourth metal foil, the rectangular plan-view shape of the fourth metal foil being larger than, and fully enclosing in a plan view, the rectangular plan-view shape of the second metal foil.

9. The support body as claimed in claim 8, wherein a plurality of the first metal foils are alternately layered with respect to a plurality of the first resin layers, and wherein a plurality of the second metal foils are alternately layered with respect to a plurality of the second resin layers.

10. The support body as claimed in claim 8, wherein a lower surface of the first resin layer positioned more outward than the outer peripheral part of the first metal foil directly contacts an upper surface of the second resin layer positioned more outward than the outer peripheral part of the second metal foil.

11. The support body as claimed in claim 8, wherein the support body includes a first support body and a second support body, wherein the first support body includes the first metal foil, the first resin layer, and the third metal foil, and wherein the second support body includes the second metal foil, the second resin layer, and the fourth metal foil.

12. A wiring substrate comprising:

a support member; and a wiring member formed on one side of the support member;

wherein the support member includes a first metal foil, a resin layer layered on the first metal foil, and a second metal foil layered on the resin layer, each of the first metal foil and the second metal foil being a copper foil, wherein the second metal foil includes a thick foil and a thin foil that is peelably adhered to the thick foil, the thin foil being thinner than the thick foil, wherein the thick foil contacts the resin layer, wherein the wiring member includes a first wiring layer, an insulating layer layered on the first wiring layer, and a second wiring layer layered on the insulating layer, each of the first wiring layer and the second wiring layer being copper, and the insulating layer being resin, wherein both the insulating layer of the wiring member and the resin layer of the support member are made of an epoxy type resin, or both the insulating layer of the wiring member and the resin layer of the support member are made of a polyimide type resin, wherein the first wiring layer is in direct contact with an upper surface of the thin foil, and is thicker than the thin foil, wherein the insulating layer is layered on the thin foil and covers an upper surface of the first wiring layer and a side surface of the first wiring layer, wherein the insulating layer includes a via hole penetrating the insulating layer, wherein the first wiring layer and the second wiring layer are connected by way of the via hole, and wherein a total number of metal foil layers from an exposed lower surface of the support member to the upper surface of the thin foil is equal to a total number of wiring layers in the wiring member.

13. The wiring substrate as claimed in claim 12,
wherein a plurality of the first metal foils are alternately layered with respect to a plurality of the resin layers, and
wherein a plurality of the second wiring layers are alternately layered with respect to a plurality of the insulating layers.

14. The wiring substrate as claimed in claim 12, further comprising:
a solder resist layer provided on the second wiring layer.

15. The wiring substrate as claimed in claim 12, wherein a thickness of the thin foil is 1.5 micrometers to 5 micrometers, and a thickness of the first wiring layer is 5 micrometers to 20 micrometers.

16. The wiring substrate as claimed in claim 12, wherein a thickness of the first metal foil is 7 micrometers to 50 micrometers, a thickness of the thick foil being 10 micrometers to 50 micrometers, a thickness of the thin foil being 1.5 micrometers to 5 micrometers, a thickness of the resin layer being 10 micrometers to 50 micrometers, a thickness of the first wiring layer being 5 micrometers to 20 micrometers, a thickness of the second wiring layer being 5 micrometers to 20 micrometers, and a thickness of the insulating layer being 10 micrometers to 50 micrometers.

17. The wiring substrate as claimed in claim 12, wherein the resin layer is a woven or non-woven cloth impregnated with resin.

18. The wiring substrate as claimed in claim 12, wherein the insulating layer of the wiring member is a woven or non-woven cloth impregnated with resin.

* * * * *